(12) United States Patent
Sakamoto et al.

(10) Patent No.: US 8,058,563 B2
(45) Date of Patent: Nov. 15, 2011

(54) INTERPOSER AND METHOD FOR MANUFACTURING INTERPOSER

(75) Inventors: Hajime Sakamoto, Ogaki (JP); Toshiki Furutani, Ogaki (JP); Hiroshi Segawa, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 403 days.

(21) Appl. No.: 12/345,295

(22) Filed: Dec. 29, 2008

(65) Prior Publication Data

US 2009/0175023 A1 Jul. 9, 2009

Related U.S. Application Data

(60) Provisional application No. 61/038,949, filed on Mar. 24, 2008, provisional application No. 61/017,430, filed on Dec. 28, 2007.

(51) Int. Cl.
*H05K 1/03* (2006.01)

(52) U.S. Cl. ........ 174/256; 174/261; 174/255; 361/760; 361/767

(58) Field of Classification Search .................. 361/792, 361/728, 729, 736, 790, 795, 760, 767, 771, 361/783; 174/250, 255–259, 260, 261, 262
See application file for complete search history.

(56) References Cited

U.S. PATENT DOCUMENTS

| | | | | |
|---|---|---|---|---|
| 5,310,965 A | * | 5/1994 | Senba et al. | 174/250 |
| 5,461,545 A | * | 10/1995 | Leroy et al. | 361/765 |
| 6,037,044 A | * | 3/2000 | Giri et al. | 428/209 |
| 6,252,178 B1 | * | 6/2001 | Hashemi | 174/260 |
| 6,737,741 B2 | * | 5/2004 | Imasu et al. | 257/723 |
| 2007/0128465 A1 | * | 6/2007 | Liu et al. | 428/689 |

FOREIGN PATENT DOCUMENTS

| | | |
|---|---|---|
| JP | 2005-317705 | 11/2005 |
| JP | 2006-019368 | 1/2006 |
| JP | 2006-294692 | 10/2006 |

* cited by examiner

*Primary Examiner* — Hoa C Nguyen
(74) *Attorney, Agent, or Firm* — Oblon, Spivak, McClelland, Maier & Neustadt, L.L.P.

(57) ABSTRACT

An interposer includes an inorganic insulating layer, a first wiring formed in or on a surface of the inorganic insulating layer, an organic insulating layer formed over the inorganic insulating layer and on the first wiring, a second wiring formed on the organic insulating layer, and a conductor portion connecting the first wiring and the second wiring.

20 Claims, 19 Drawing Sheets (a)

(b)

(a)

(b)

INTERPOSER AND METHOD FOR MANUFACTURING INTERPOSER

CROSS-REFERENCE TO RELATED APPLICATIONS

The present application claims the benefits of priority to U.S. Application Nos. 61/017,430, filed Dec. 28, 2007, and 61/038,949, filed Mar. 24, 2008. The contents of those applications are incorporated herein by reference in their entirety.

BACKGROUND OF THE INVENTION

1. Field of the Invention

The present invention relates to an interposer and a method of manufacturing an interposer.

2. Discussion of the Background

A substrate referred to as an interposer is used as an intermediate substrate onto which a semiconductor element such as a logic and memory is loaded.

Japanese Laid-Open Patent Publication No. 2006-19368 describes an interposer in which there is formed an inorganic insulating layer comprising $SiO_2$ on an Si surface and there is formed a pattern by copper plating on the surface of the inorganic insulating layer, and a semiconductor device onto which a semiconductor element is loaded.

Japanese Laid-Open Patent Publication No. 2006-294692 describes an interposer having wiring layers and a semiconductor device onto which a semiconductor element is loaded, and for each of the wiring layers of the interposer, a resin such as a polyimide resin is used for an insulating layer and the wiring is formed with a plating method.

The contents of these publications are incorporated herein by reference in their entirety.

SUMMARY OF THE INVENTION

According to one aspect of the present invention, an interposer includes an inorganic insulating layer, a first wiring formed in or on a surface of the inorganic insulating layer, an organic insulating layer formed over the inorganic insulating layer and on the first wiring, a second wiring formed on the organic insulating layer, and a conductor portion connecting the first wiring and the second wiring.

According to another aspect of the present invention, a method of manufacturing an interposer includes forming an inorganic insulating layer over a support substrate, forming a first wiring in or on a surface of the inorganic insulating layer, forming an organic insulating layer over the inorganic insulating layer and the first wiring, forming a second wiring on the organic insulating layer, and forming a conductor portion connecting the second wiring and the first wiring.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2 (b) is a cross-sectional view illustrating one example in which a protective film is provided and a semiconductor is loaded on the interposer illustrated in FIG. 2 (a);

FIG. 13 (b) is a cross-sectional view illustrating an example of a setup in which a protective film is provided on and a semiconductor element is loaded onto the interposer shown in FIG. 13 (a);

DETAILED DESCRIPTION OF THE PREFERRED EMBODIMENTS

Figure 1:
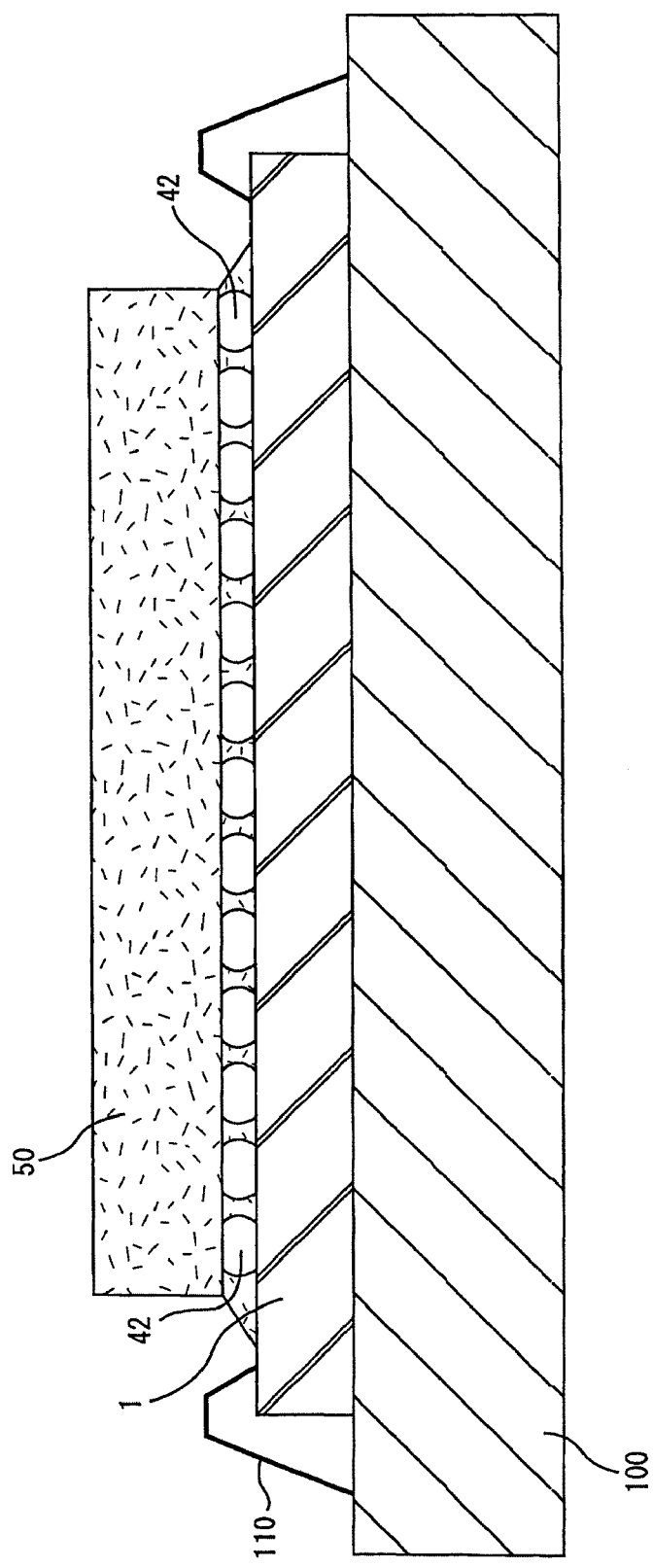
FIG. 1 is a sectional view illustrating an interposer according to the first embodiment of the present invention.

The embodiments will now be described with reference to the accompanying drawings, wherein like reference numerals designate corresponding or identical elements throughout the various drawings.

FIG. 1 is a cross-sectional view illustrating an interposer according to an embodiment of the present invention. An interposer 1 in accordance with the present embodiment is interposed, as illustrated in FIG. 1, between a semiconductor element 50 and a printed wiring board 100. The semiconductor element 50 and the interposer 1 are connected via bumps 42, for example. The interposer 1 and the printed wiring board 100 are connected via wires 110, for example.

First Embodiment

Figure 2:
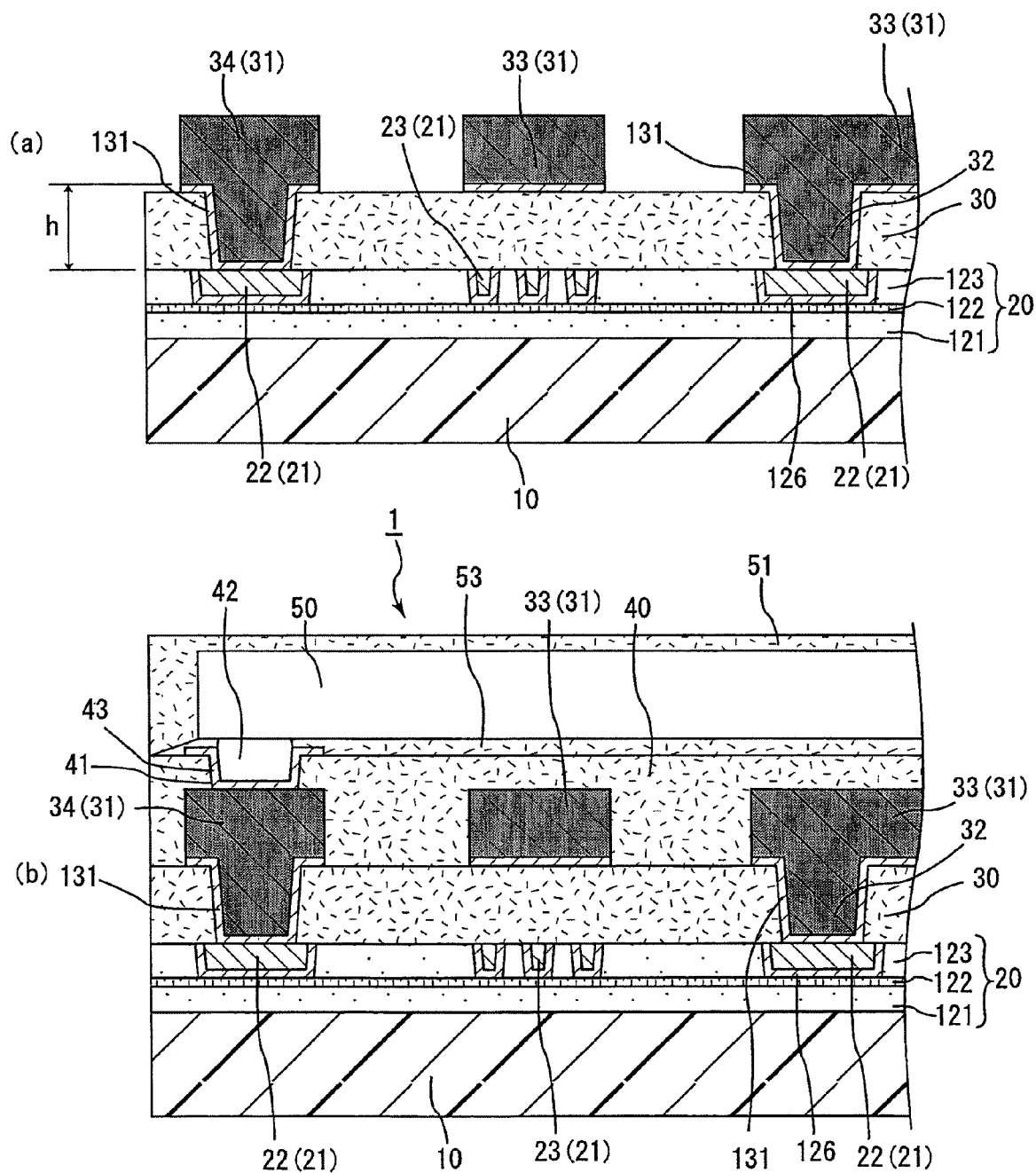
FIG. 2 (a) is a cross-sectional view illustrating one example of a portion of an interposer according to an embodiment of the present invention.

FIG. 2 (a) is a cross-sectional view illustrating one example of a portion of an interposer according to an embodiment of the present invention, and FIG. 2 (b) is a cross-sectional view illustrating one example in which a protective film is provided and a semiconductor is loaded on the interposer illustrated in FIG. 2 (a). The interposer 1 in accordance with the present embodiment includes a support substrate 10, an inorganic insulating layer 20 made of an inorganic material, the first wiring 21 formed in the inorganic insulating layer 20, an organic insulating layer 30 made of an organic material, the second wiring 31 formed on the surface of the organic insulating layer 30, and a via conductor as a conductor portion for electrically connecting the first wiring 21 and the second wiring 31. FIG. 2 (b) illustrates a set-up in which there is further provided a protective film 40 on the interposer in accordance with the present embodiment and a semiconductor 50 is loaded. In the following, the details of each of these sections will be described in the order of the lower side first with reference to FIG. 2 (a) and FIG. 2 (b).

First, the support substrate 10 will be described.

The materials to form the support substrate 10 in accordance with the present embodiment include silicon, silicon nitride, silicon carbide, aluminum nitride, mullite, etc. Of those, it is preferable to use silicon from the standpoint of the surface thereof having a high degree of flatness allowing a fine wiring to be formed. While the thickness of this support substrate 10 is not particularly limited, it is preferably 30 to 800 μm. When the thickness of the support substrate 10 is less than 30 μm, it is possible that the rigidity of the interposer cannot be secured. Conversely, when the thickness of the support substrate 10 exceeds 800 μm, the thickness of the interposer as a whole ends up being increased such that it is not preferable. The inorganic insulating layer 20 in accordance with the present embodiment is a layer made of an inorganic material such as $SiO_2$ (silicon dioxide) and $Si_3N_4$ (silicon nitride). An example of a specific layer constitution will be described under the paragraphs for a method of manufacturing an interposer in accordance with the present embodiment.

The first wiring 21 includes multiple via lands 22 and a wiring portion 23 for providing an electrical connection between predetermined via lands 22. Namely, on a portion of the first wiring 21 formed in the inorganic insulating layer 20 there is formed a via land 22 to be connected with a via conductor, and a connection is provided between predetermined via lands 22 with the wiring portion 23.

The first wiring 21 is formed in the inorganic insulating layer 20 such that the surface of the first wiring 21 including the surface of via land 22 is disposed on nearly the same plane with the surface of the inorganic insulating layer 20. The first wiring 21 is made up of copper plating and a seed layer 126 underneath the copper plating. An example of a seed layer constitution will be described under the paragraphs for a method of manufacturing an interposer in accordance with the present embodiment.

According to the present embodiment, the first wiring 21 is formed with a damascene method, and the L/S of the first wiring 21 is set smaller as compared to the L/S of the second wiring 31 to be described later (L/S=wire width/distance between adjacent wires). In addition, the L/S of the first wiring is not particularly limited, and while it is preferably around L/S=1 μm/1 μm, it may be finer than that. In addition, the L/S of the first wiring herein referred to refers to the L/S of the wiring portion 23 excluding the via lands 22. The thickness of this first wiring 21 is less than the thickness of the second wiring to be described later. While the thickness of the first wiring 21 in accordance with the present embodiment is not particularly limited, it is preferably no greater than 2 μm. When the thickness of the first wiring 21 is no greater than 2 μm, the process becomes easier and the cost reduction can be expected besides it allowing the wiring to be fine.

Since the first wring 21 is formed with a damascene method, the surface formed with the inorganic insulating layer 20 and the first wiring 21 is flat.

According to the present embodiment, the diameter of the via lands 22 are set larger than the diameter of the via conductor to be described later. In addition, when comparing the diameter of a via land and the diameter of a via conductor, it will suffice to compare the diameters of the faces against each other at which the via land and via conductor come in contact with each other.

The organic insulating layer 30 in accordance with the present embodiment is made of an organic material and formed on the inorganic insulating layer 20 and on the first wiring 21. This organic insulating layer 30 has openings 36 (refer to FIG. 6 (a)), and in the openings 36 there are formed via conductors 32 as conductor portions. Further, on the surface of the organic insulating layer 30 there is formed the second wiring 31.

The bottom face of the via conductor 32 is connected to the via land 22. Further, on a portion of the second wiring 31 formed on the organic insulating layer 30 there is formed a pad 34. And, this second wiring 31 and the first wiring 21 are electrically connected by the via conductor 32. In addition, the pad 34 is a section connected, when a semiconductor element is loaded, to the connection terminal of the semiconductor element via a solder bump, etc.

And, the second wiring 31 has a wiring portion 33 besides the pad 34. While the depictions in FIG. 2 (a) and FIG. 2 (b) omit what the wiring portion 33 of the second wiring 31 is connected to (the right-hand side in the figures), the wiring portion 32 is electrically connected with a predetermined pad.

The organic insulating layer 30 is a layer made of a thermosetting resin, a photosensitive resin, a resin having a photosensitive group added to a portion of a thermosetting resin, a thermoplastic resin or a resin combination containing these resins, etc. Specifically, it is preferably made of a photosensitive polyimide resin.

The via conductor 32 and the second wiring 31 are formed with copper plating and a seed layer 131 underneath the copper plating. An example of a seed layer constitution will be described under the paragraphs for a method of manufacturing an interposer in accordance with the present embodiment. According to the present embodiment, the via conductor 32 and the second wring 31 are formed with a semi-additive method, for example, and the L/S of the second wiring 31 is set larger as compared to the L/S of the first wiring 21. While the L/S of the second wiring 31 in accordance with the present embodiment is L/S=3 μm/3 μm, it is not limited to this. It will suffice to make a suitable determination depending on the number of the lines of the second wiring and the area of the region on which the second wiring is formed. In addition, the L/S of the second wiring 31 referred to herein refers to the L/S of the wiring portion 33 excluding the pad 34. The second wiring 31 is greater in thickness than the first wiring 21. While the thickness of the second wiring 31 in the present embodiment is not particularly limited, it is preferably greater than 2 μm and no greater than 30 μm. When the thickness of the second wiring 31 is within this range, the warpage of an interposer can suitably be controlled. Further, it becomes possible to reduce the wiring resistance of the second wiring 31. In addition, the thickness of an interposer would not increase. In addition, the thickness of the second wiring means the average value of each of the values obtained from the measurements taken, with the use of a scanning electron microscope, based on the cross sections at the ten locations taken at random in the longitudinal direction thereof. It is likewise with the thickness of the first wiring. The ratio of the thickness of the second wiring to the thickness of the first wiring is greater than 1 and no greater than 15. When the ratio of the thickness of the above-described second wring to the thickness of the first wiring is less than 1, the rigidity of an interposer cannot sufficiently be secured, and it is possible that it would give rise to the warpage of the interposer resulting from the difference in thermal expansion coefficients between the semiconductor element and the interposer. Conversely, when the ratio of the thickness of the above-described second wiring to the thickness of the first wiring exceeds 15, the aspect ratio of the second wiring ends up being high if one were to assume that the wiring width were the same, and when the organic insulating layer expands and contracts due to the heat cycle, for example, the second wiring easily follows that expansion and contraction of the organic insulating layer such that it is possible that the adhesion of the second wiring to the organic insulating layer drops.

The area of the cross section of the second wiring 31 is preferably larger than the area of the cross section of the first wiring 21, preferably, 3 to 10 times in particular. A larger area of the cross section of the second wiring leads to a smaller wiring resistance per unit length of the second wiring. For example, when the aspect ratios for the first wiring 21 and the second wiring 31 both are 1:1, provided that the L/S of the first wiring is 1 μm/1 μm and the L/S of the second wiring is 3 μm/3 μm, the area of the cross section of the second wiring end up being 9 times the area of the cross section of the first wiring. In addition, when comparing the areas of the cross sections of the first wiring 21 and of the second wiring 31, the areas of the cross sections of the wiring portions of each of the wirings are compared. And, the ratio of the height of the via conductor (the height of the conductor portion) (h) to the thickness of the first wiring is no greater than 5. This makes it possible to greatly reduce the impact the stress generated resulting from the expansion and contraction of the organic insulating layer upon the conductor portion. The height of this via conductor is also measured with the use of a scanning electron microscope.

Next, a protective film 40 and a semiconductor element 50 will be described. The protective film 40 is formed on the organic insulating layer 30 and on the second wiring 31. This protective film 40 has openings partially exposing a pad 34. Namely, as illustrated in FIG. 2 (b), the outer periphery areas of the pad 34 are covered with the protective film 40.

While the material for the protective film 40 is not particularly limited, it is preferably an organic material from the standpoint of the adhesion to the organic insulating layer 30. And, in the opening 41 there is formed a bump 42 made of solder via a barrier metal layer 43, and a semiconductor element 50 is connected to the interposer via this bump 42. And, an underfill resin 53 is filled between the semiconductor element 50 and the interposer. Further, the semiconductor element 50 is sealed with a seal resin 51.

Figure 3:
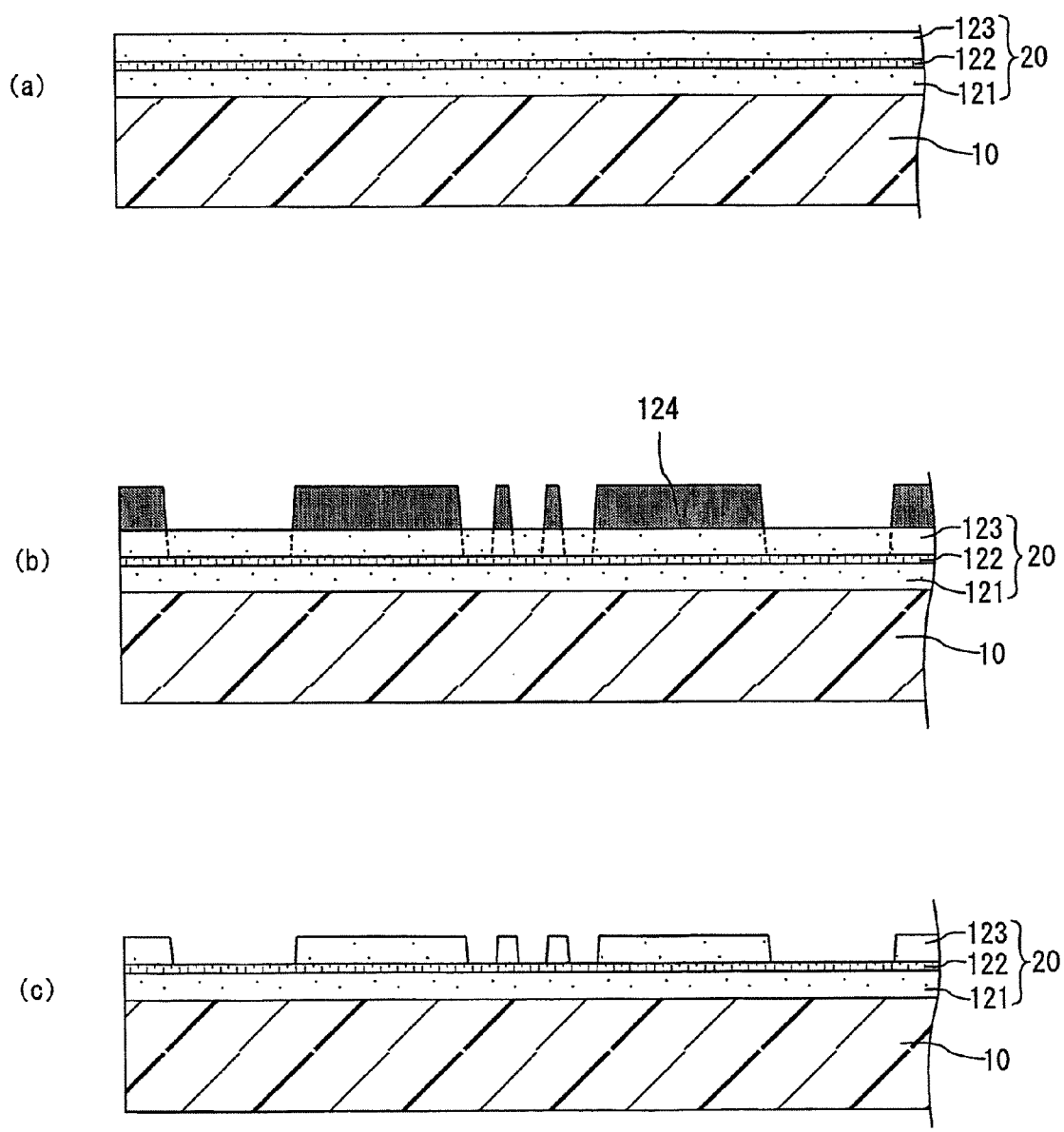
FIG. 3 (a), FIG. 3 (b) and FIG. 3 (c) are cross-sectional views illustrating part of a manufacturing process of the interposer according to the embodiment illustrated in FIG. 1.

In the following, a method of manufacturing an interposer in accordance with the present embodiment will be described with the use of drawings. FIG. 3 (a), FIG. 3 (b) and FIG. 3 (c) as well as FIG. 4 (a), FIG. 4 (b) and FIG. 4 (c) are cross-sectional views illustrating parts of a manufacturing process of an interposer in accordance with the first embodiment. First, as illustrated in FIG. 3 (a), on a support substrate 10 an inorganic insulating layer 20 (for example, the first $SiO_2$ layer 121, $Si_3N_4$ layer 122, and the second $SiO_2$ layer 123) is formed. As for the support substrate 10 in accordance with the present embodiment, a silicon wafer is used, and on the upper face of the silicon wafer 10 the first $SiO_2$ layer 121, $Si_3N_4$ layer 122, and the second $SiO_2$ layer 123 are each formed with a CVD (Chemical Vapor Deposition) method.

Next, a resist 124 is coated, and the resist 124 at the predetermined position whereat the openings are formed in the second $SiO_2$ layer 123 is removed by exposure and development. These steps are together illustrated in FIG. 3 (b).

Next, dry etching (reactive ion etching) is performed to etch the second $SiO_2$ layer 123 at the portions where the resist 124 is not formed. By this, the pattern as illustrated in FIG. 3 (c) is formed in the second $SiO_2$ layer 123. In addition, when dry etching, the $Si_3N_4$ layer 122 plays the role of the etching stopper.

Figure 4:
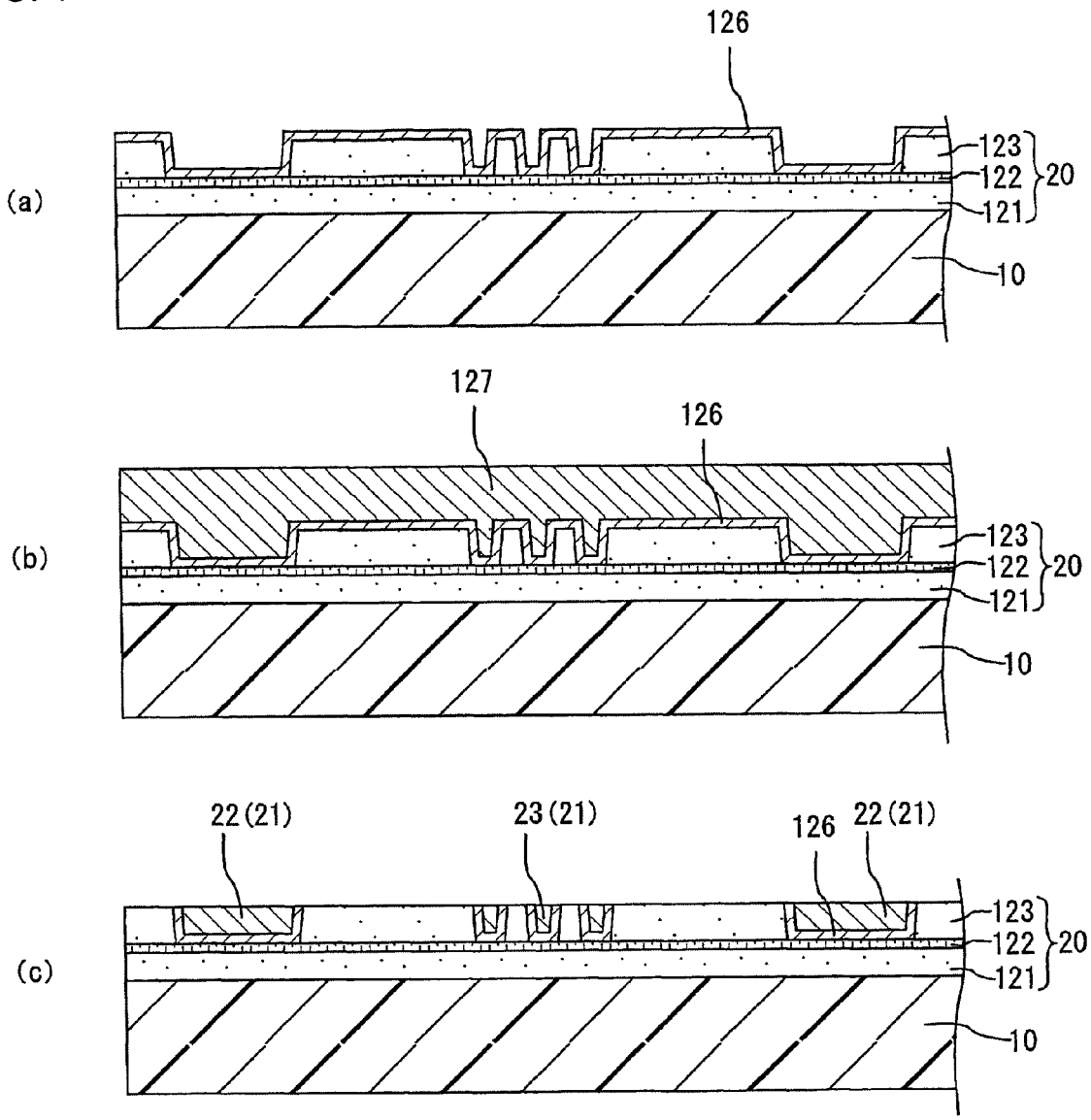
FIG. 4 (a), FIG. 4 (b) and FIG. 4 (c) are cross-sectional views illustrating part of a manufacturing process of the interposer according to the embodiment illustrated in FIG. 1.

Next, as illustrated in FIG. 4 (a), a seed layer 126 is formed by sputtering, for example, on the second $SiO_2$ layer 123 surface. In the present embodiment, while the seed layer 126 is formed of a TaN, Ta, and Cu sputtering films in the order from the bottom, it is not limited to this.

Next, as illustrated in FIG. 4 (b), using the seed layer 126 as an electricity supply layer, electrolytic-copper-plating is performed to form an electrolytic copper-plated layer 127. It will suffice to perform electrolytic copper-plating with a conventional method known to the public.

Next, as illustrated in FIG. 4 (c), CMP (Chemical Mechanical Polishing) is performed to remove the electrolytic copper-plated layer 127 and the seed layer 126 on the surface of the second $SiO_2$ layer 123. In addition, for CMP it will suffice to use a method and apparatus known in conjunction with the conventional damascene method. And, the electrolytic copper-plated layer remaining after CMP having been performed constitutes the first wiring 21 including the via land 22 and the wiring portion 23.

With the above steps, the inorganic insulating layer and the first wiring can be formed. And, on the surfaces of the inorganic insulating layer and the first wiring there may be formed an inorganic thin film such as $Si_3N_4$, etc., with CVD, for example. This inorganic thin film is provided to enhance the adhesion between the organic insulating layer and the inorganic insulating layer.

Figure 5:
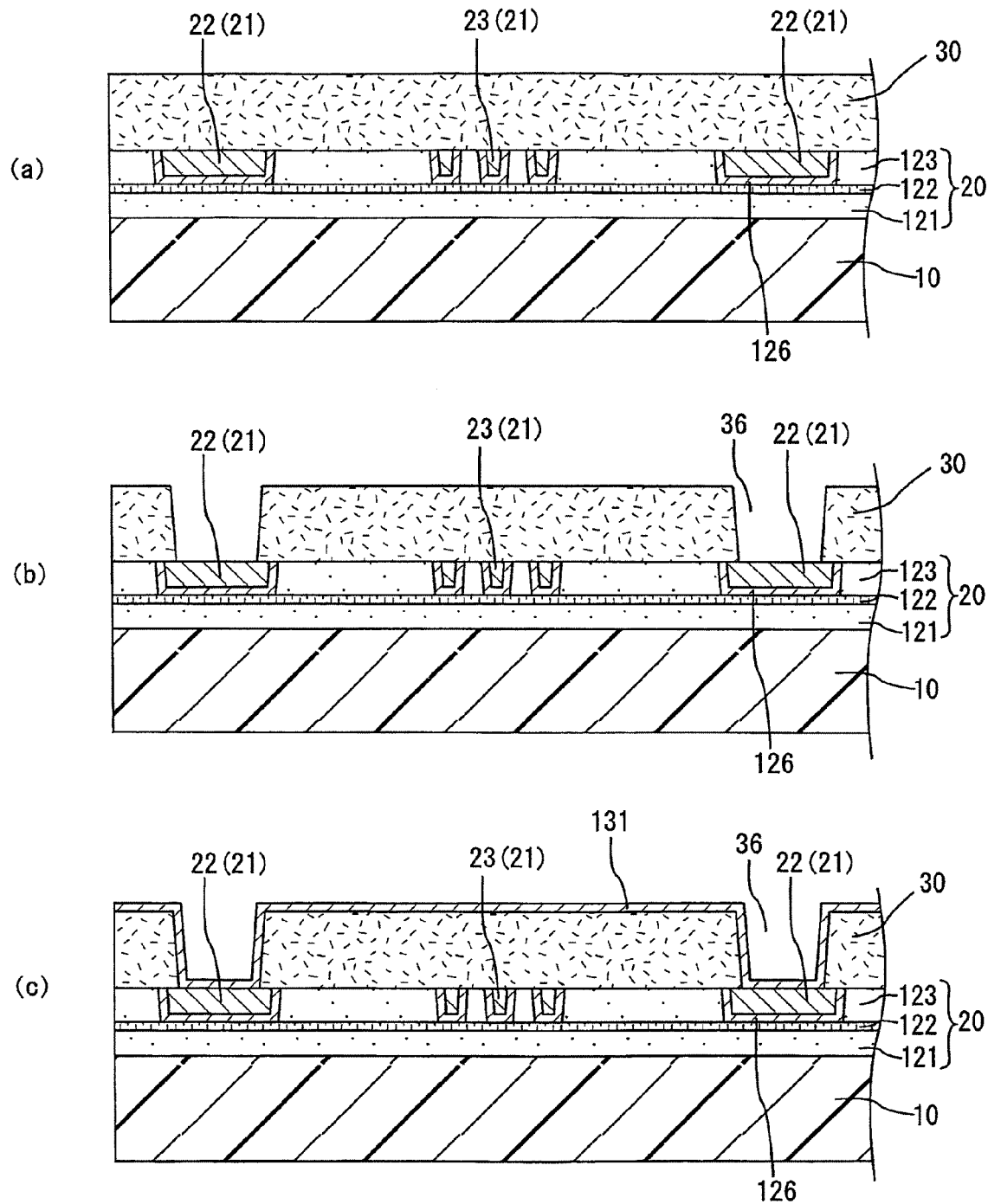
FIG. 5 (a), FIG. 5 (b) and FIG. 5 (c) are cross-sectional views illustrating part of a manufacturing process of the interposer according to the embodiment illustrated in FIG. 1.
Figure 6:
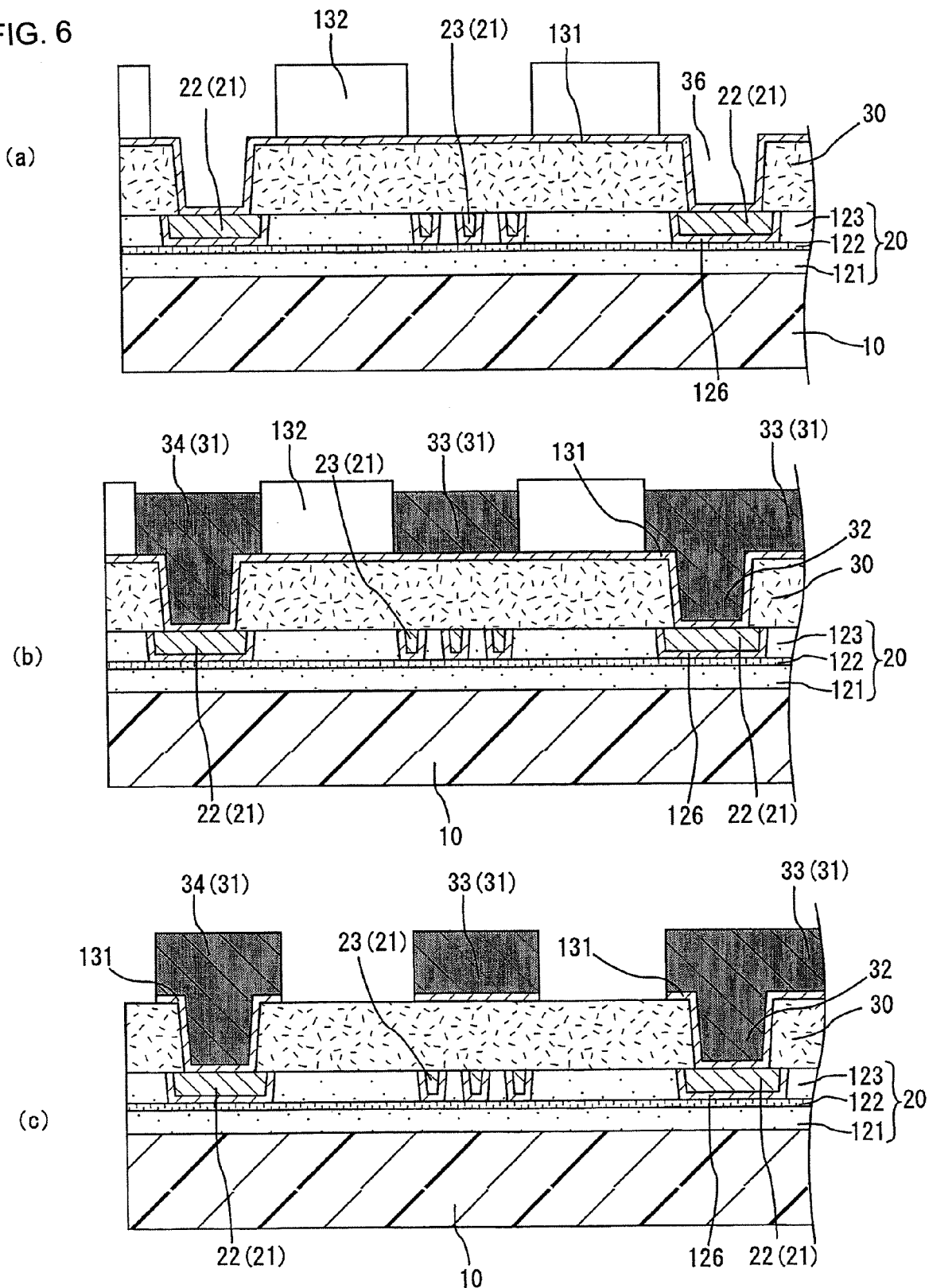
FIG. 6 (a), FIG. 6 (b) and FIG. 6 (c) are cross-sectional views illustrating part of a manufacturing process of the interposer according to the embodiment illustrated in FIG. 1.

FIG. 5(a), FIG. 5 (b) and FIG. 5 (c) as well as FIG. 6 (a), FIG. 6 (b) and FIG. 6 (c) are cross-sectional views illustrating parts of the manufacturing process of an interposer in accordance with the first embodiment. First, as illustrated in FIG. 5 (a), an organic insulating layer 30 is formed on an inorganic insulating layer 20 and the first wiring 21, and an opening 36 is formed as illustrated in FIG. 5 (b). As for the method of forming the organic insulating layer 30, a method such as an uncured photosensitive polyimide resin, for example, being coated with the use of a roll coater, etc., may be used. As for a method of forming an opening, an exposure and development treatment may be used.

Next, as illustrated in FIG. 5 (c), there is formed a seed layer 131 on the surface (including the side wall of the opening 36) of the organic insulating layer 30 and on the upper face of the via land 22 exposed from the opening 36. The seed layer 131 is formed by sputtering, for example, and formed of Ti and Cu in the present embodiment. In addition, the constitution of the seed layer 131 is not limited to this.

Next, as illustrated in FIG. 6 (a), a plating resist 132 is provided and the plating resist 132 present at the location where the second wiring is to be formed by the plating resist 132 being exposed and developed via a mask. As for a plating resist, a photosensitive dry film, etc., for example, may be used.

Continuing on, as illustrated in FIG. 6 (b), using the seed layer 131 as an electricity supply layer, electrolytic-copper-plating is performed to provide electrolytic copper-plating at the section where a plating resist 132 has been removed. This forms a via conductor 32 in the organic insulating layer 30, and, further, on the organic insulating layer 30 there is formed the second wiring 31 including a pad 34 and a wiring portion 33.

Next, as illustrated in FIG. 6 (c), the remaining plating resist is removed and at the same time the seed layer 131 underneath the plating resist removed is removed by etching. While the etching method of this seed layer 131 is not particularly limited, dry etching (reactive ion etching) is preferable from the standpoint of controlling the overetching of the electrolytic copper-plating. With the above steps, an organic insulating layer and the second wiring can be formed.

Figure 7:
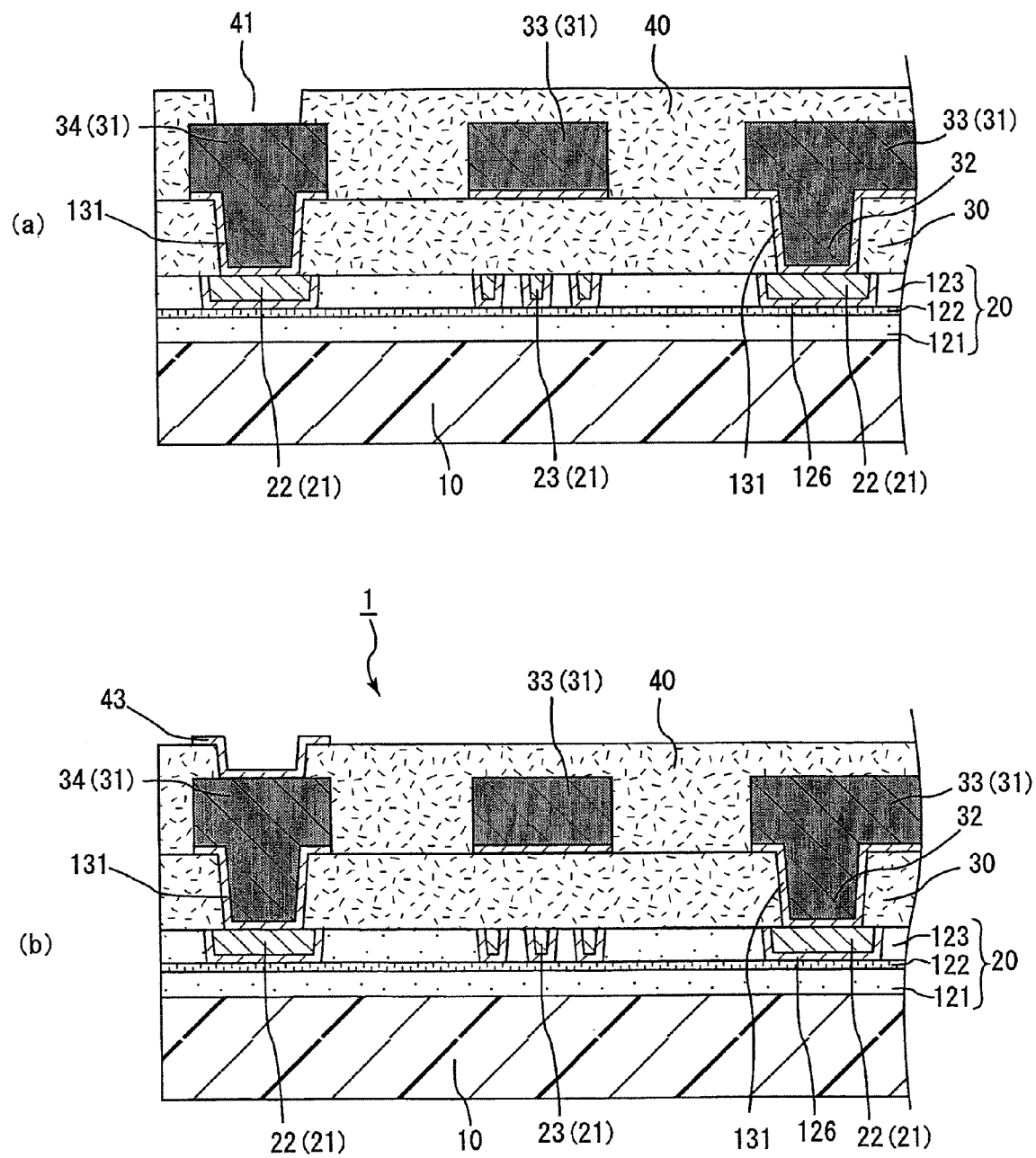
FIG. 7 (a) and FIG. 7 (b) are cross-sectional views illustrating part of a manufacturing process of the interposer according to the embodiment illustrated in FIG. 1.

FIG. 7 (a) and FIG. 7 (b) are cross-sectional views illustrating parts of the manufacturing process of an interposer in accordance with the first embodiment. First, on the organic insulating layer 30 there is formed another organic insulating layer 40. And, on the newly-formed organic insulating layer 40 an opening 41 is formed. This newly-formed organic insulating layer 40 constitutes itself as a protective film. These steps are together illustrated in FIG. 7 (a). As for the organic insulating layer 40 as a protective film, a similar material as the organic insulating layer 30 may be used. And, for the method of forming the opening 41 as well, a similar method as with forming the opening 36 in the organic insulating layer 30 may be used.

Next, as illustrated in FIG. 7 (b), in the opening 41 provided in the organic insulating layer 40 there is formed a barrier metal layer 43. This barrier metal layer 43 is formed by sputtering tantalum nitride and tantalum, for example, sequentially. In addition, the material constituting and a method of manufacturing this barrier metal layer 43 are not particularly limited. And, the illustration is omitted but Ni/Au is plated on the surface of the barrier metal layer 43 exposed from the opening of the protective film. This is to secure adhesion between the solder and the pad when solder joining described below is performed. In addition, it will suffice to perform the formation of a protective film and the formation of a barrier metal layer as necessary.

Figure 8:
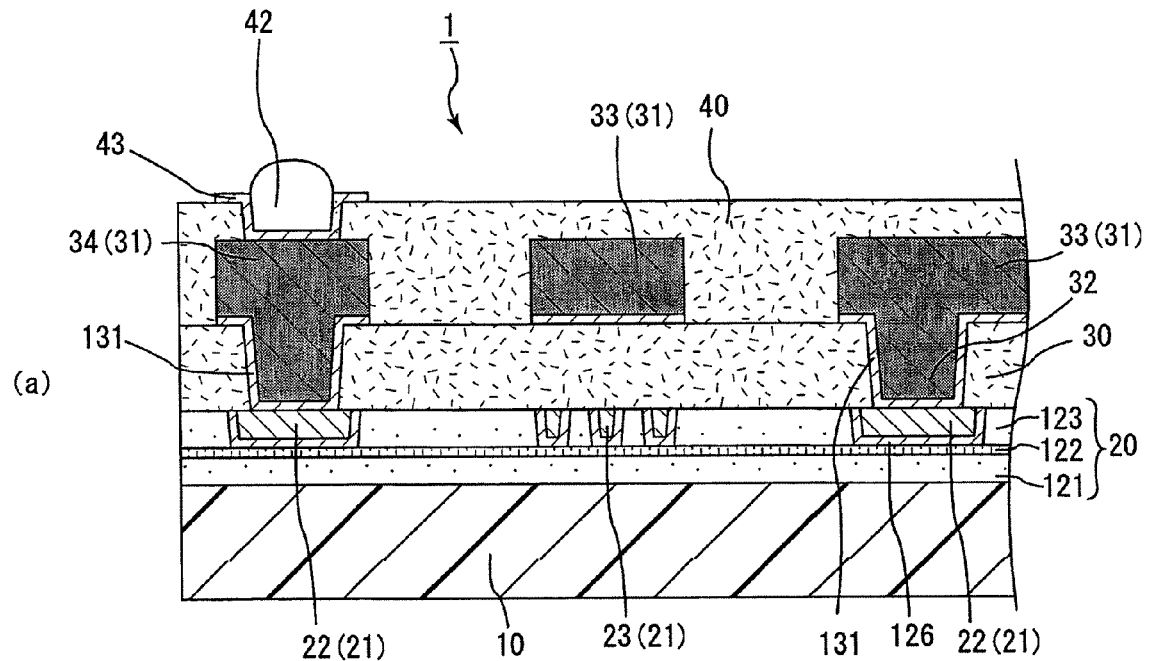
FIG. 8 (a) and FIG. 8 (b) are cross-sectional views illustrating an example of the step in which a semiconductor element is loaded on the interposer according to the embodiment illustrated in FIG. 1.
Figure 8:
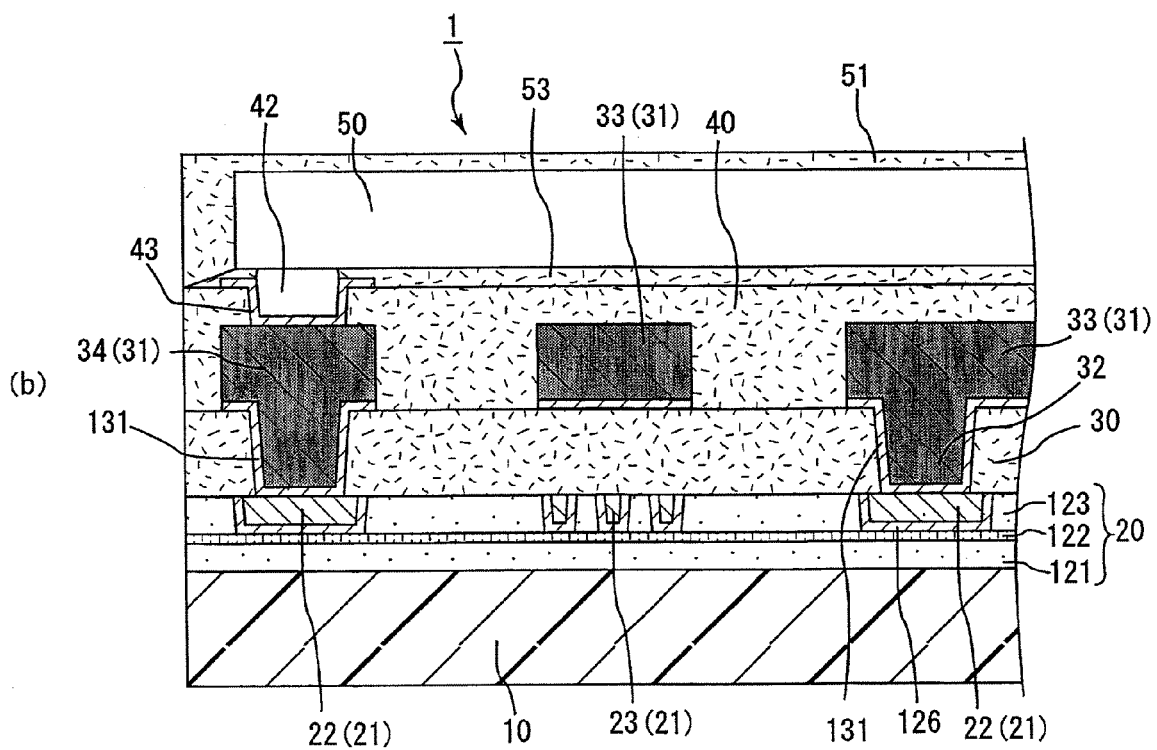

Continuing on, a step of loading a semiconductor element onto the interposer in accordance with the present embodiment will be described. FIG. 8 (a) and FIG. 8 (b) are cross-sectional views illustrating an example of loading an interposer in accordance with the first embodiment. First, as illustrated in FIG. 8 (a), on the barrier metal layer 43 there is formed a bump 42 made of solder.

Next, a semiconductor element 50 is mounted onto the interposer via this bump 42 with a flip-chip mounting. And, an underfill resin 53 is filled between the semiconductor element 50 and the interposer, which is hardened. Next, the semiconductor element 50 which has been loaded is sealed in as it is sealed all around with a seal resin 51. These steps are together illustrated in FIG. 8 (b). In addition, as for the underfill resin and the seal resin, it is suffice to use resins that are known to the public.

And, when a silicon wafer is used for a support substrate and an interposer is formed on the silicon wafer, the use of a silicon wafer sufficiently large with respect to the dimensions of the interposer allows the formation of multiple interposers on one sheet of silicon wafer. When forming multiple interposers on one sheet of silicon wafer, the silicon wafer is sliced with a method such as dicing at an appropriate time prior to the step of loading a semiconductor element or following the step of loading a semiconductor element such that it can be divided up per interposer. This allows an efficient manufacture of interposers.

In the following, the advantages of an interposer in accordance with the present embodiment and a method of manufacturing the interposer will be listed.

(1) According to an interposer in accordance with the present embodiment, there is present an organic insulating layer around the bottom portion of a via conductor as a conductor portion. Accordingly, even when the conductor portion expands on account of a semiconductor element generating heat, for example, the organic insulating layer present around the bottom portion of the conductor portion makes it possible to ease the thermal stress coming from the conductor portion. Accordingly, the thermal stress is controlled from being concentrated at the bottom portion of the via conductor, enabling in turn to control the occurrence of cracks in the insulating layer.

(2) And, on the lower face of the organic insulating layer, there is provided an integrated inorganic insulating layer. Since this secures rigidity and in turn the tensile stress of the organic insulating layer with respect to the via conductor is reduced, it becomes possible for the separation between the first wiring and the via conductor to be controlled.

(3) And, since a protective film is formed on the surface of the outermost layer organic insulating layer, the inner wirings are protected and it becomes possible to control the damage thereto.

(4) And, since there is provided an inorganic thin film between the inorganic insulating layer and the organic insulating layer, the adhesion between the inorganic insulating layer and the organic insulating layer can be enhanced.

(5) And, the interposer in accordance with the present embodiment has a support substrate made of silicon. Its having a support substrate adds rigidity to the interposer, allowing, for example, the warpage of the interposer due to thermal expansion to be reduced. Further, since a support substrate made of silicon has an extremely high degree of flatness, the formation of fine wiring on the surface thereof becomes possible. In addition, the warpage of the interposer due to the difference in thermal expansion coefficients between a semiconductor element to be mounted and interposers can further be controlled.

(6) And, according to the interposer in accordance with the present embodiment, it is set such that the second wiring is thicker than the first wiring, and the ratio of the thickness of the second wiring to the thickness of the first wiring is greater than 1 and no greater than 15. As such, since the organic insulating layer is sandwiched by the second wiring having a high Young's modulus and the inorganic insulating layer by the provision of the organic insulating layer between the second wiring relatively thicker than the first wiring and the inorganic insulating layer having a high Young's modulus, rigidity is added to the interposer. As a result of it, the warpage of the interposer resulting from the difference in the above-described thermal expansion coefficients can be controlled.

And, when the organic insulating layer expands and contracts due to the heat cycle as well, it becomes easy to secure the adhesion between the second wiring and the organic insulating layer.

(7) And, according to the interposer in accordance with the present embodiment, the ratio of the height of the via conductor to the thickness of the first wiring is no greater than 5. This being the case, it becomes possible that the impact of the stress generated resulting from the expansion and contraction of the organic insulating layer on the via conductor can extremely be reduced.

(8) In the method of manufacturing an interposer in accordance with the present embodiment, the first wiring is formed in the inorganic insulating layer, the organic insulating layer is formed on the inorganic insulating layer and on the first wiring, and the via conducting is formed for electrically connecting the second wiring and the first wiring. According to such steps, an interposer in which the stress bearing on the via conductor can effectively reduced even when the semiconductor element generates heat, in turn leading to non-occurrence of cracks inside the insulating layer and no separation between the via portion and the via land would occur can be manufactured.

(9) In the method of manufacturing an interposer in accordance with the present embodiment, the first wiring is formed with a damascene method and the second wiring is formed with a semi-additive method. This allows the first wiring to be accurately formed in fine wiring and further wiring to be formed with a high degree of flatness. And, it can handily form the second wiring having a low wiring resistance to manufacture an interposer.

Second Embodiment

The present embodiment differs from the above-described first embodiment in that there is no support substrate 10. Namely, after the semiconductor element 50 has been sealed in all around with the seal resin 51 as illustrated in FIG. 8 (b), the support substrate 10 is stripped. While a method of stripping the support substrate is not particularly limited, it can be done with grinding and etching.

First, the first face side (the face on which the surface of the support substrate is exposed) made of a silicon wafer is ground with a grinder to thin the thickness of the support substrate. While the amount of grinding is not limited, it is preferable that the grinding is performed until the thickness of the support substrate is down to about 100 μm. As to a grinder, a grinder for grinding a silicon wafer can suitably be used.

Continuing on, the support substrate (silicon wafer) thinned by grinding is etched with the use of an etchant such as potassium hydroxide to remove the entirety. While the etchant to be used for etching is not particularly limited so long as it is what is used for the etching of silicon wafers, potassium hydroxide aqueous solution, etc., for example, may be used. While an apparatus used for etching is not particularly limited, an apparatus used for wet etching of silicon wafers can suitably be used. And, prior to forming an inorganic insulating layer 20 on the support substrate 10 (silicon wafer) in FIG. 3 (a), a stripping layer may be formed on the surface of the support substrate 10. As for the material for this stripping layer, it may be a metal such as Cu and Ni, or may be a resin. That being the case, when stripping the support substrate 10, it becomes possible that the interposer and the support substrate can easily be separated via the stripping layer. While the method therefor is not particularly limited, etching is used when a stripping layer is of a metal.

When a stripping layer is of a resin, an alkaline dissolution, etc., for example, can be mentioned. That being the case, the support substrate (silicon wafer) can be reused.

Figure 9:
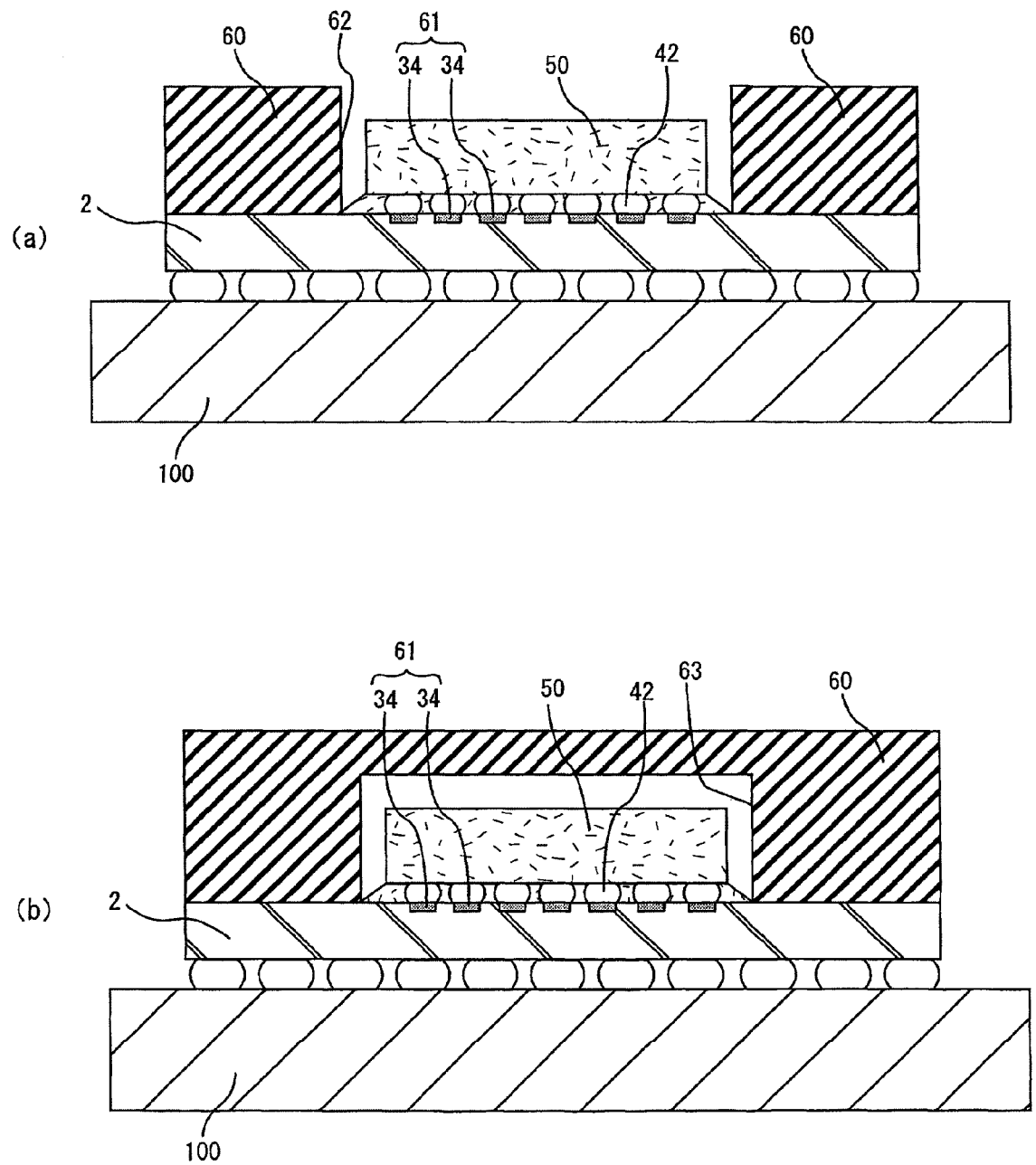
FIG. 9 (a) and FIG. 9 (b) are cross-sectional views illustrating an example in which a stiffener is provided on an interposer according to the second embodiment of the present invention.

As to FIG. 9, they are cross-sectional views illustrating an example where a stiffener is provided on an interposer in accordance with the second embodiment. In the interposer 2 in accordance with the present embodiment, a stiffener 60 as illustrated in FIG. 9 may be provided on the surfacemost face of the interposer 2 via an adhesive from the standpoint of enhancing the rigidity. As to the shape of the stiffener 60, it may be frame-like provided with an opening portion 62 exposing a group of pads 61 made up of multiple pads 34 as illustrated in FIG. 9 (a), for example, or may be cover-like provided with a recessed portion 63 exposing a group of pads 61 as illustrated in FIG. 9 (b), for example. While the material for this stiffener is not particularly limited, a metal material such as copper is preferable from the standpoint of securing an ability to release heat.

In the following, the advantages of a method of manufacturing an interposer in accordance with the present embodiment will be listed.

(10) The method of manufacturing an interposer in accordance with the present embodiment includes a step for removing the support substrate. By removing the support substrate, it can manufacture an interposer having a thin thickness and a low mounted height when a semiconductor element is loaded.

(11) The provision of a stiffener enhances the rigidity of an interposer. It results in the interposer being sufficiently able to withstand the thermal stress resulting from the difference in thermal expansion coefficients between it and a semiconductor element, for example, such that it makes the interposer as a whole difficult to warp. Accordingly, the occurrence of cracks at the joining portion (the external connection terminal such as a solder bump, etc.) between a semiconductor element and an interposer can be controlled.

Third Embodiment

Figure 10:
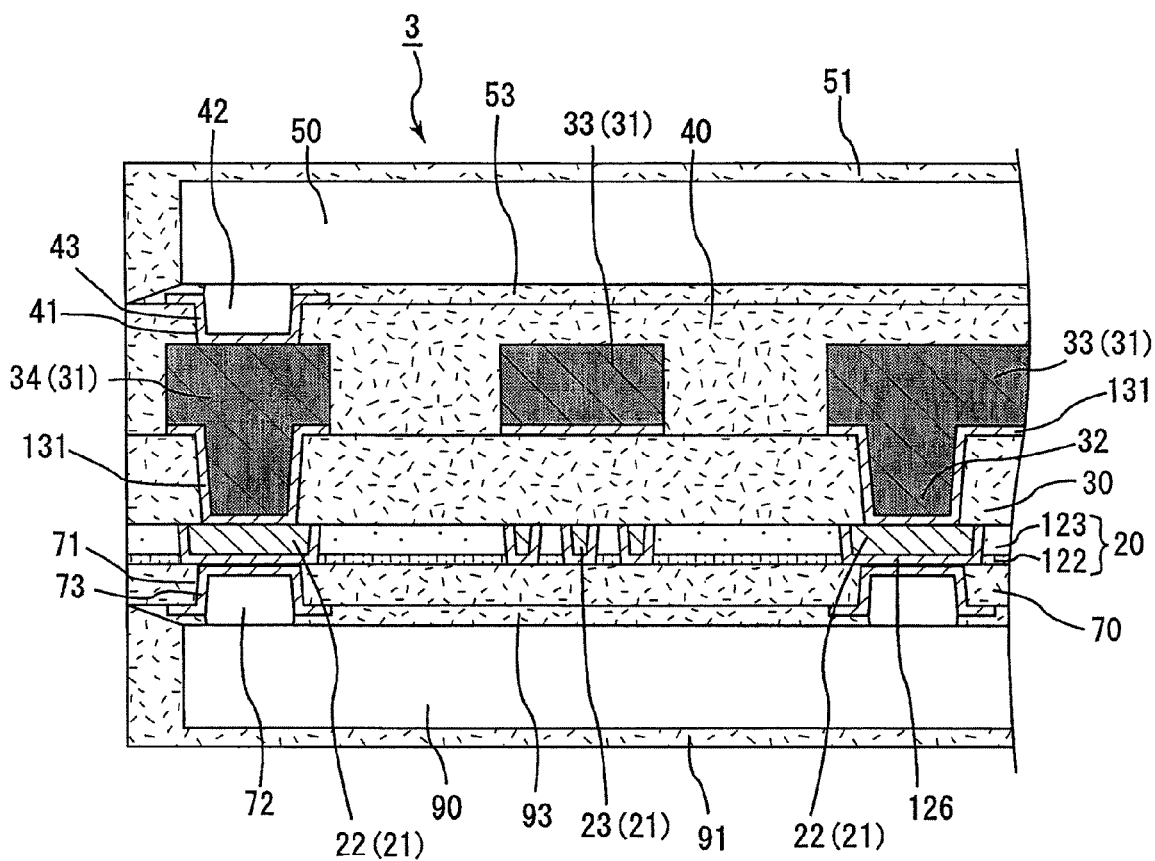
FIG. 10 is a cross-sectional view illustrating a portion of an interposer according to another embodiment of the present invention.

In the following, the third embodiment being one embodiment in accordance with the present invention will be described. FIG. 10 is a cross-sectional view illustrating a portion of another example of an interposer in accordance with the present invention. The interposer 3 in accordance with the present embodiment differs, while it is similar to the above-described second embodiment in that the support substrate 10 is absent, from the above-described second embodiment in that a semiconductor element can be mounted on both faces (refer to FIG. 10). Namely, there is formed a protective film 70 on the lower faces of the inorganic insulating layer 20 and the first wiring 21, and in this protective film 70 there is provided an opening 71 at the location positioned directly below the via land 22. And, in this opening 71 there is formed a bump 72 via the barrier metal layer 73 as in the first embodiment, and the semiconductor element 90 is connected to the interposer via this bump 72. And, an underfill resin 93 is filled between the semiconductor element 90 and the interposer. Further, the semiconductor element is sealed in with a seal resin 91.

Figure 11:
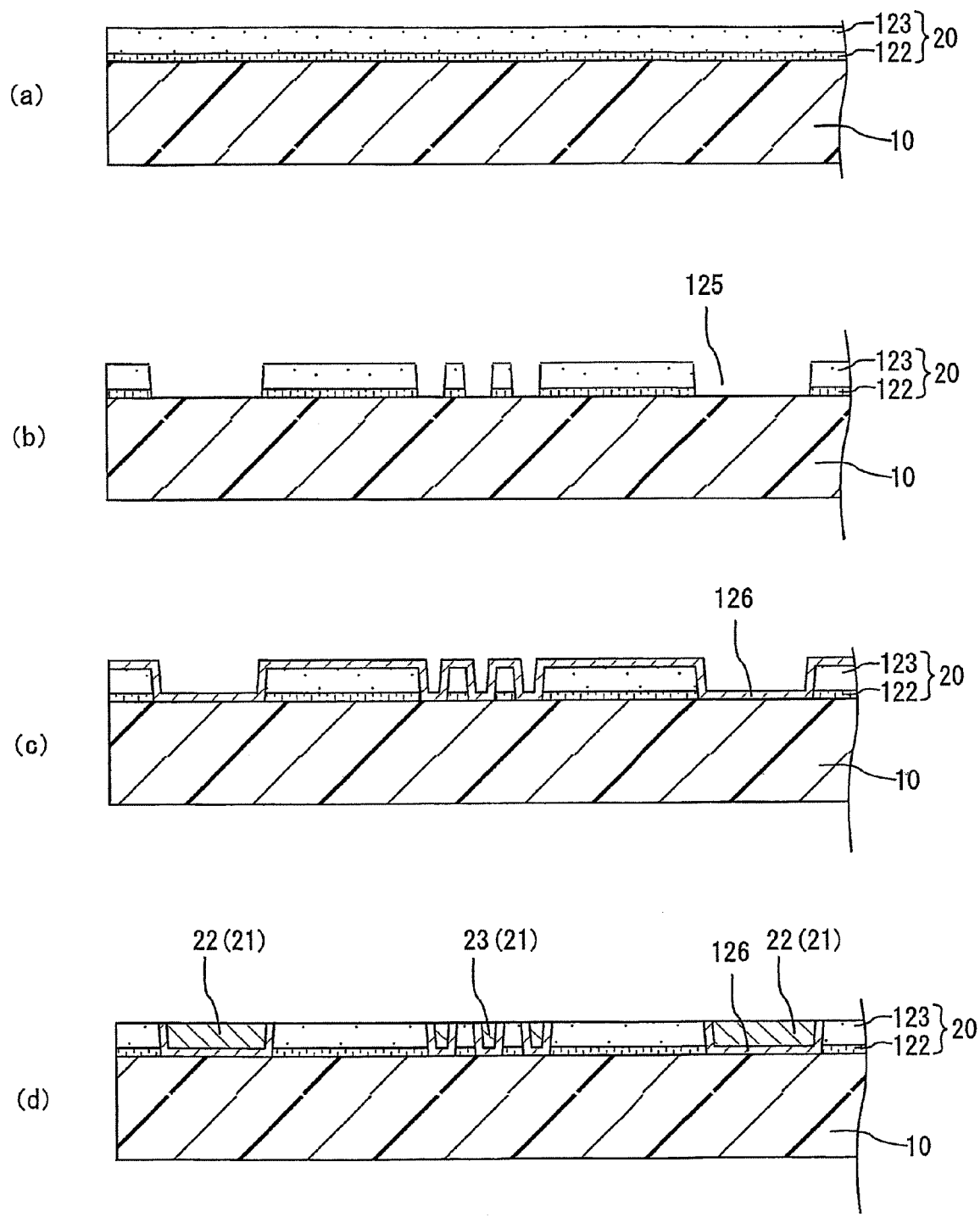
FIG. 11 (a), FIG. 11 (b), FIG. 11 (c) and FIG. 11 (d) are cross-sectional views illustrating part of a manufacturing process of an interposer according to the third embodiment of the present invention.

A method of manufacturing an interposer in accordance with the present embodiment will be described in the following. FIG. 11 (a), FIG. 11 (b), FIG. 11 (c) and FIG. 11 (d) as well as FIG. 12 (a), FIG. 12 (b) and FIG. 12 (c) are cross-sectional views illustrating a portion of a manufacturing process of the interposer in accordance with the third embodiment. First, as illustrated in FIG. 11 (a), on the support substrate there are formed $Si_3N_4$ layer 122 and $SiO_2$ layer 123 sequentially with CVD, etc., such that there is provided an inorganic insulating layer 20. Next, at a desired location on this inorganic insulating layer 20 there is formed an opening 125 with dry etching (FIG. 11 (b)). Then, a seed layer 126 is formed as in the first embodiment (FIG. 11 (c)), and using this seed layer 126 as an electricity supply layer, electroplating is performed and polishing is carried out with CMP, to form the first wiring 21 (FIG. 11 (d)).

Figure 12:
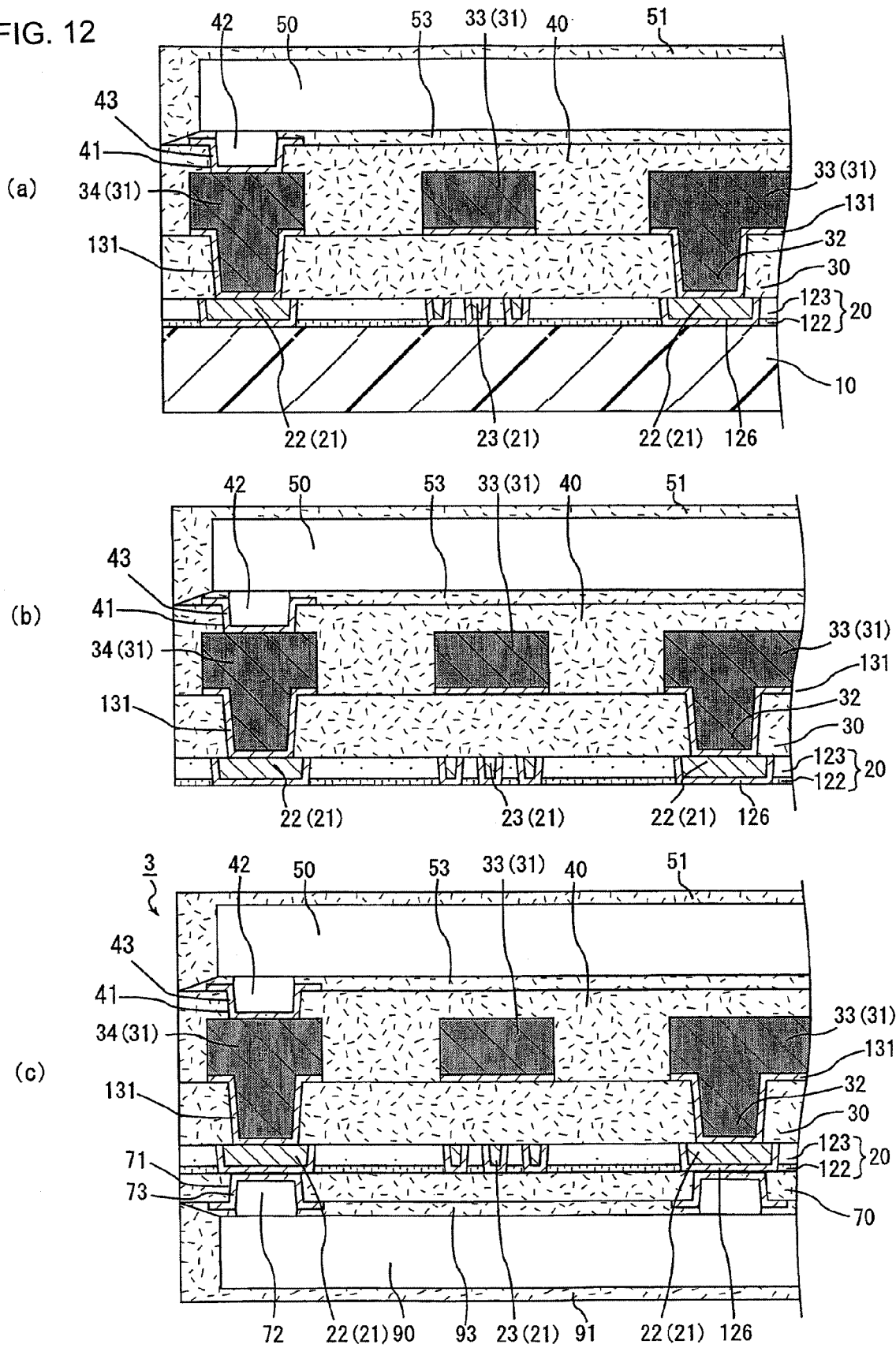
FIG. 12 (a), FIG. 12 (b) and FIG. 12 (c) are cross-sectional views illustrating part of a manufacturing process of the interposer according to the third embodiment.

Then, as in the above-described first embodiment, an organic insulating layer 30 and the second wiring 31, etc., are formed and a semiconductor element 50 is loaded and at the same time is worked as far as resin sealing (FIG. 12 (a)).

Continuing on, a support substrate is removed to expose the lower faces of the first wiring 21 and the inorganic insulating layer 20 (FIG. 12 (b)). Further, a protective film 70 is formed on the lower faces of the first wiring 21 and the inorganic insulating layer 20 and an opening 71 is formed at the location positioned directly below the via land 22. Then, the barrier metal layer 73 and a bump 72 are formed in the opening to mount a semiconductor element 90 (FIG. 12 (c)). The present embodiment is able to exhibit the advantages (1) through (9) described in conjunction with the first embodiment and the advantage (10) described in conjunction with the second embodiment. In this third embodiment, the interposer 3 may be mounted on a printed board (mother board) via a bump 72 without a semiconductor element 90 being mounted.

Fourth Embodiment

In the following, the fourth embodiment being one embodiment in accordance with the present invention will be described. According to an interposer in accordance with the present embodiment, to the interposer described in conjunction with the first embodiment, in an inorganic insulating layer or on the surface of an organic insulating layer there is formed at least one of a power feed layer or ground layer. Or, a passive element such as a capacitor may be formed. When a ground layer is formed in an inorganic insulating layer, for example, a microstrip structure including the second wiring located directly above is formed. As a result, the characteristic impedance can be matched, which makes it possible for the signal transmission to be stabilized.

The present embodiment is able to exhibit the advantages (1) through (9) described in conjunction with the first embodiment and able to exhibit the following effect.

(12) The provision of at least a power feed layer, ground layer, or passive element in the region where no wiring is formed on an inorganic insulating layer or an organic insulating layer provides a high density interposer with this region being effectively utilized and having no wasted portion. In turn, an interposer can be made with a stronger power and an enhanced signal property, and being thinner, and smaller.

Firth Embodiment

Figure 13:
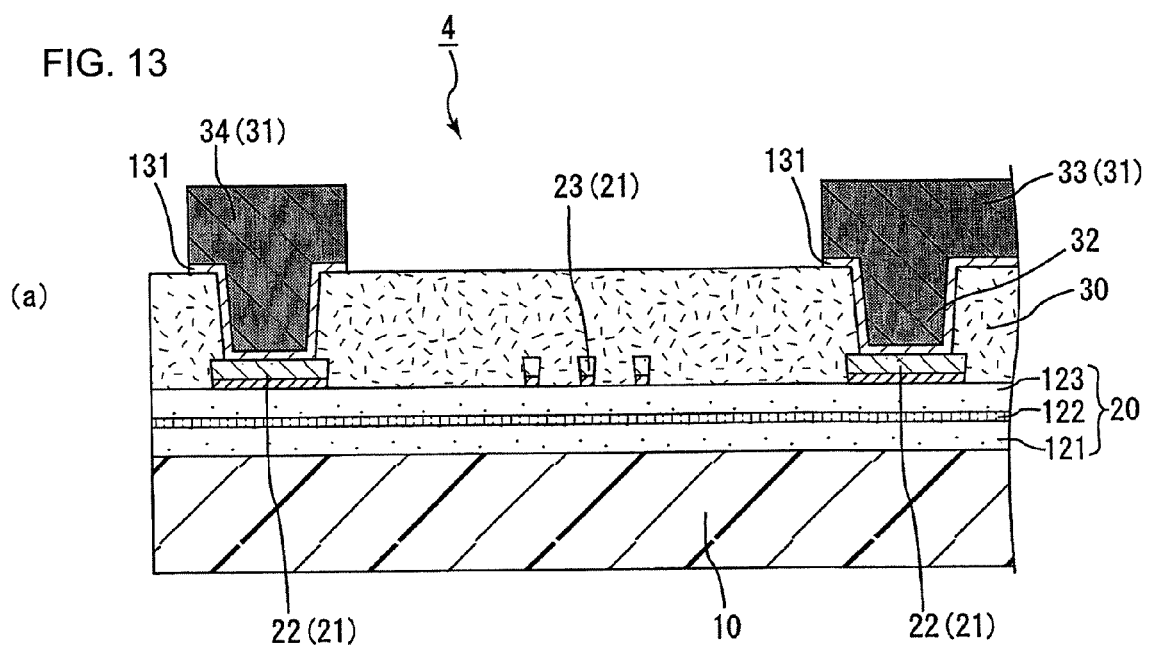
FIG. 13 (a) is a cross-sectional view illustrating a portion of an interposer according to another embodiment of present invention.
Figure 13:
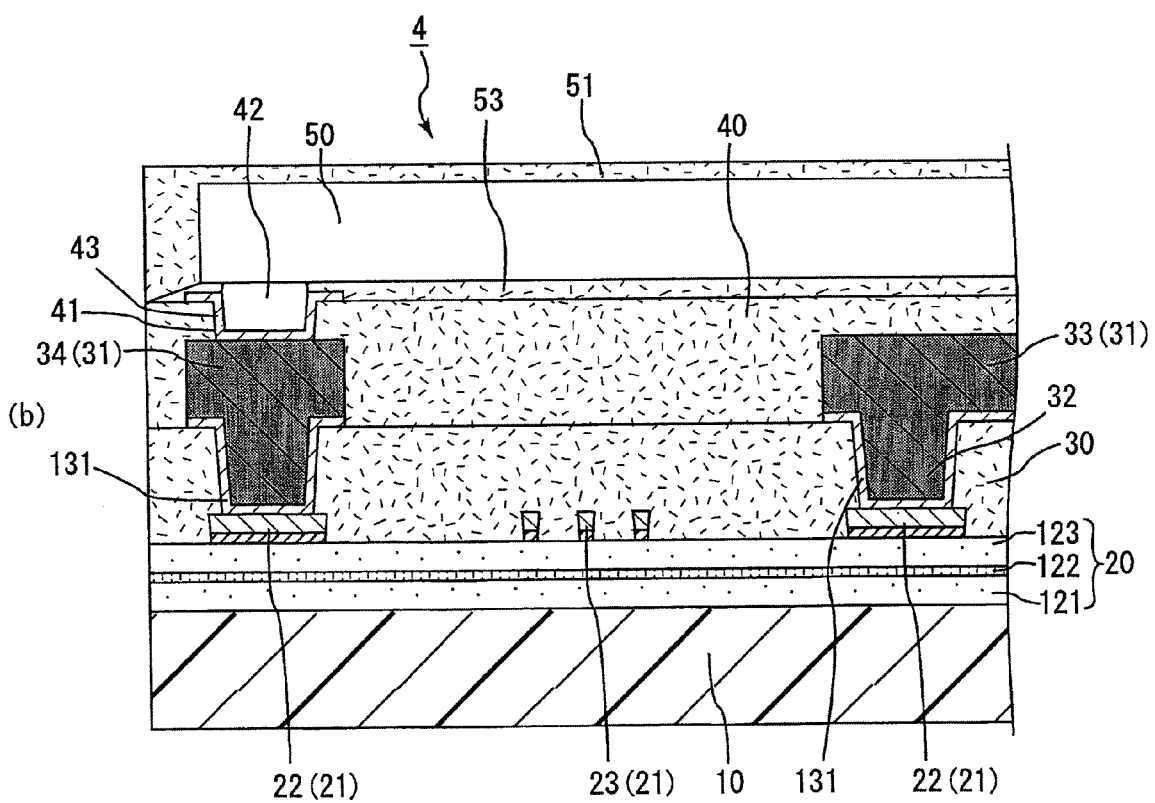

In the following, the fifth embodiment being one embodiment in accordance with the present invention will be described. FIG. 13 (a) is a cross-sectional view illustrating a portion of another example of an interposer in accordance with present invention and FIG. 13 (b) a cross-sectional view illustrating an example of a setup in which a protective film is provided on and a semiconductor element is loaded onto the interposer illustrated in FIG. 13 (a).

An interposer in accordance with the present embodiment is similar to an interposer in accordance with the first embodiment except that the first wiring is formed on the surface of an inorganic insulating layer. In the following, these details of an interposer in accordance with the present embodiment will be described with reference to FIG. 13 (a) and FIG. 13 (b).

In the interposer 4 in accordance with the present embodiment, the first wiring 21 including a via land 22 and a wiring portion 23 is formed on the surface of the inorganic insulating layer 20 and the surface of the first wiring 21 is disposed on the upper portion of the surface of the inorganic insulating layer 20. Namely, at the bottom of the via land 22, the inorganic insulating layer 20 is present.

The rest of the structures is the same as the interposer 1 in accordance with the first embodiment, and a organic insulating layer 30 having an opening is formed on the inorganic insulating layer 20 and a via conductor 32 is formed in the opening of the organic insulating layer, namely, on the via land 22. And, on the organic insulating layer 30 there is formed the second wiring 31 having a pad 34 and a wiring portion 33. Further, on the organic insulating layer 30 and on the second wiring there is formed a protective film 40 and a semiconductor element 50 is loaded.

Figure 14:
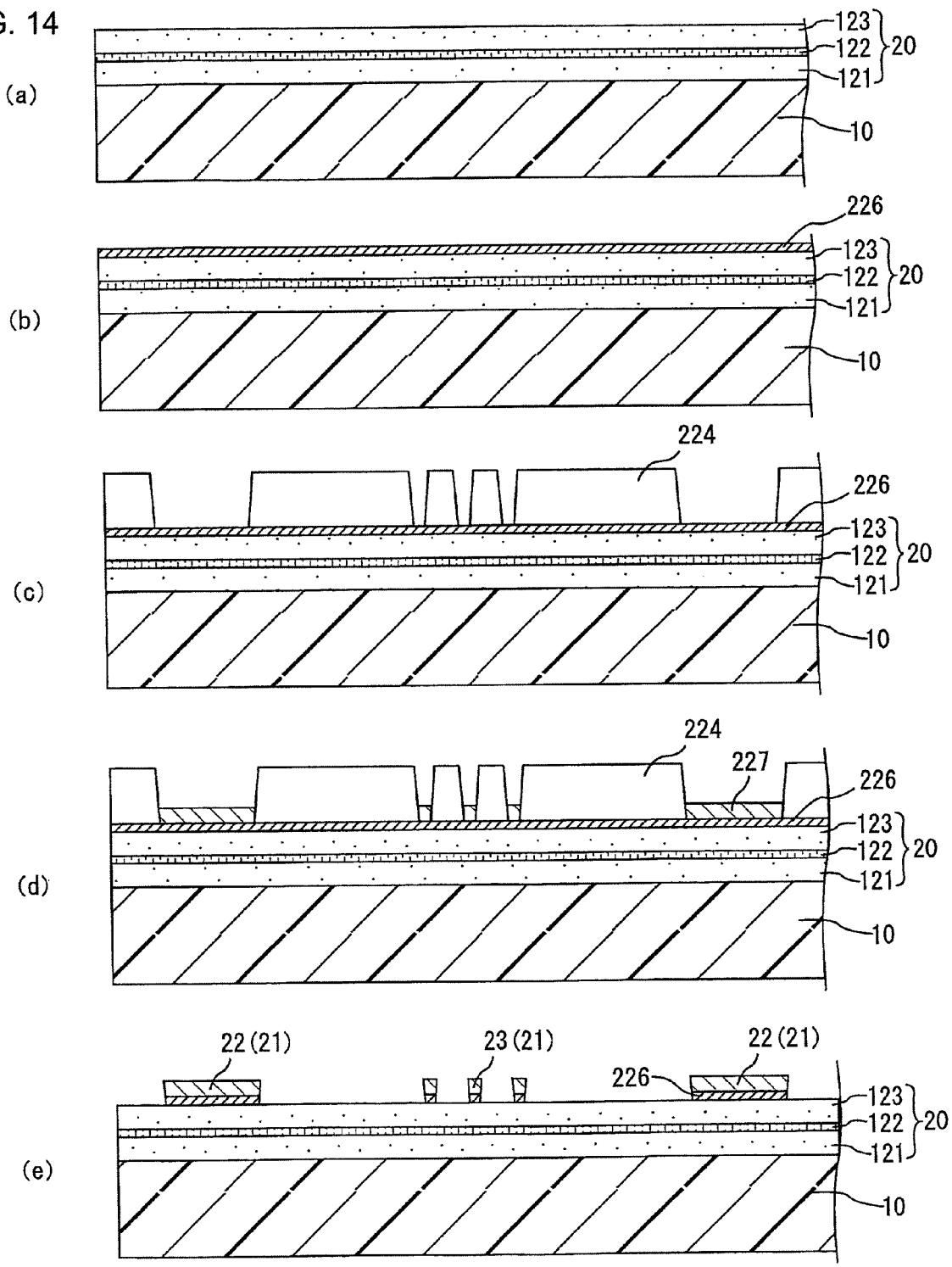
FIG. 14 (a), FIG. 11 (b), FIG. 14 (c), Fig. (d) and FIG. 14 (e) are cross-sectional views illustrating part of a manufacturing process of an interposer according to the fifth embodiment of the present invention.

Continuing on, as to a method of manufacturing the interposer in accordance with the present embodiment, only the steps differing from the method of manufacturing an interpose in accordance with the first embodiment will be described. FIG. 14 (a), FIG. 14 (b), FIG. 14 (c), Fig. (d) and FIG. 14 (e) are cross-sectional views illustrating part of the manufacturing process of an interposer in accordance with the fifth embodiment.

As to the method of manufacturing an interposer in accordance with the present embodiment, as illustrated in FIG. 14 (a), on the support substrate 10 there is formed an inorganic insulating layer 20 (for example, the first $SiO_2$ layer 121, $Si_3N_4$ layer 122 and the second $SiO_2$ layer 123) sequentially with CVD. In addition, the structure of the inorganic insulating layer 20 is not limited to this.

Continuing on, as illustrated in FIG. 14, (b), a metal layer 226 is formed on the surface of the inorganic insulating layer 20. This metal layer 226 is formed by sputtering, for example, and made of Cu.

Next, as illustrated in FIG. 14 (c), a plating resist 224 is provided and the plating resist 224 present at the location where the first wiring is to be formed is removed by exposing and developing the plating resist 224 being via a mask. For a plating resist, a photosensitive dry film, for example, may be used.

Next, as illustrated in FIG. 14 (d), electrolytic copper-plating is performed with the metal layer 226 as an electricity supply layer such that a copper-plated layer 227 is formed at the section where the plating resist 224 has been removed.

Next, as illustrated in FIG. 14 (e), the plating resist is removed and at the same time the metal layer 226 underneath the plating resist removed is removed by etching. With the above steps, the first wiring 21 including the via land 22 and the wiring portion 23 on the surface of the inorganic insulating layer 20 can be formed. Then, by performing the steps after the formation of the organic insulating layer as with the method of manufacturing an interposer in accordance with the first embodiment, an interposer in accordance with the present embodiment can be manufactured. In addition, the formation process of the via land 22 and the wiring portion 23 onto the surface of the inorganic insulating layer is not limited to this. Namely, following a metal film 226 having been formed on the inorganic insulating layer 20 by sputtering, for example, the first wiring 21 having desired via land 22 and wiring portion 23 may be formed by etching this metal film 226. The present embodiment as well exhibits the same advantages as with the above-described first embodiment.

And, in this fifth embodiment as well, the support substrate may be removed as with the second embodiment.

Sixth Embodiment

In the following, the sixth embodiment being one embodiment in accordance with the present invention will be described. According to the present embodiment, to the interposer described in conjunction with the fifth embodiment there is formed at least one of a power feed layer and a ground layer on the surfaces of an inorganic insulating layer or an organic insulating layer. And, a passive element such as a capacitor may be formed.

As a method of providing a power feed layer or a ground layer on the surface of an inorganic insulating layer or on the surface of an organic insulating layer, the same method as for the fourth embodiment may be used.

The present embodiment can exhibit, in addition to the advantages described in conjunction with the fifth embodiment, the advantage (12) described in conjunction with the fourth embodiment.

Seventh Embodiment

Figure 15:
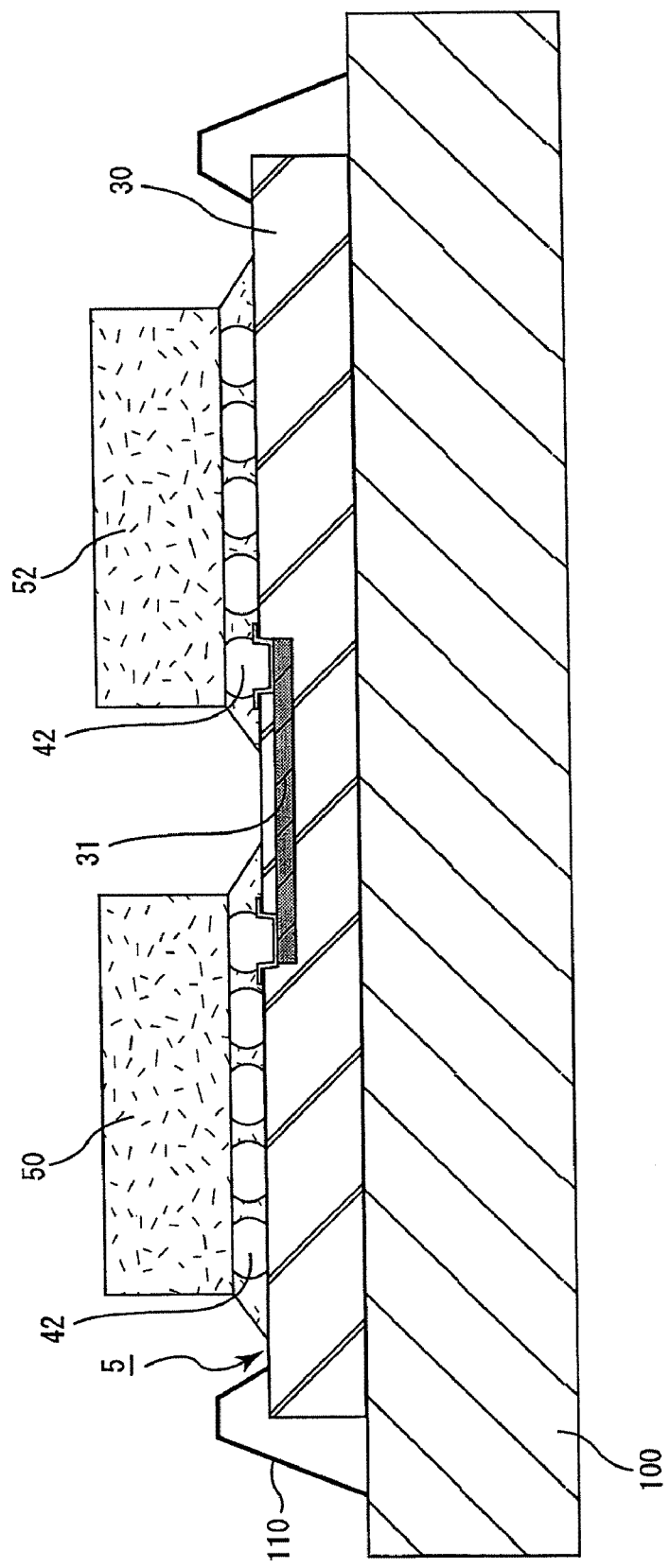
FIG. 15 is a cross-sectional view illustrating a portion of an interposer according to another embodiment of the present invention.

Onto an interposer in accordance with the present embodiment, multiple semiconductor elements may be mounted, and the structure thereof is such that specific semiconductor elements among the multiple semiconductor elements are connected via the second wiring only. FIG. 15 is a cross-sectional view illustrating as a portion of another example of an interposer in accordance with the present invention. Onto the interposer 5 illustrated in FIG. 15 multiple semiconductor elements 50, 52 can be mounted. The semiconductor element 50 and the semiconductor element 52 are connected via the second wiring 31 connected to bumps 42.

As for the semiconductor element 50 and the semiconductor element 52 used with this seventh embodiment, the semiconductor element 50 is a power regulator module and the semiconductor element 52 is a CPU, for example. The connection between these semiconductor elements via the second wiring only allows the resistance of the wiring between the semiconductor elements to be lowered. As a result of it, there is no voltage drop occurring in the second wiring, allowing an application of a suitable voltage to a semiconductor element such as a CPU.

And, the wiring resistance between semiconductor elements not being an issue, the semiconductor elements may be connected via the first wiring and the second wiring.

Eighth Embodiment

Figure 16:
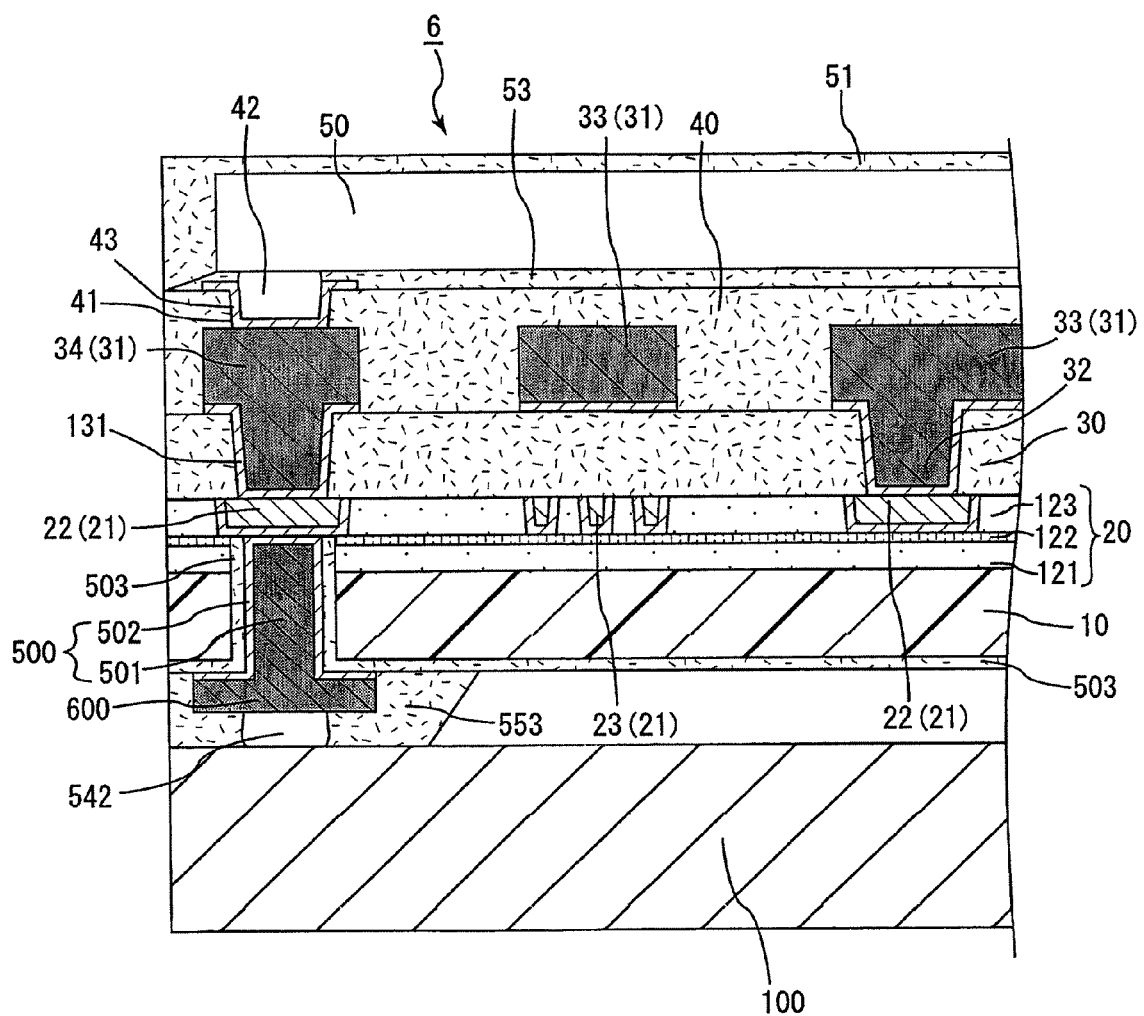
FIG. 16 is a cross-sectional view illustrating a portion of an interposer according to another embodiment of the present invention.

FIG. 16 is a cross-sectional view illustrating as a portion of another example of an interposer in accordance with the present invention. In the interposer 6 illustrated in FIG. 16 there is provided a through-hole electrode 500 in a support substrate 10. In this case, the front and back of the interposer are electrically connected, allowing a semiconductor element to be mounted on the lower face side of the interposer as well. And, the interposer could be mounted onto a printed wiring board (a motherboard, for example) via solder bumps.

The through-hole electrode 500 is made of a copper plating layer 501 and a conductor thin layer 502 below the copper plating film. The through-hole electrode 500 and the support substrate 10 are separated with an insulating film 503, and there is also formed an insulating film 503 on the rear face side of the support substrate 10.

The upper side of the through-hole electrode 500 (the front face side of the support substrate) is connected to a conductor (a via land 22 in FIG. 16) formed inside an inorganic insulating layer 20. The lower side of the though-hole electrode 500 (the rear face side of the support substrate) is connected to a pad 600 (a wiring) formed on the rear face of the support substrate 10. Namely, the pad 600 (a wiring) formed on the rear face of the support substrate 10 and the first wiring 21 (the via land 22) are electrically connected with the though-hole electrode 500. And, on the pad 600 there is formed a bump 542. The interposer 6 is mounted onto the printed wiring board 100 via this bump 542. An underfill resin 553 is filled between the printed wiring board 100 and the interposer 6. In addition, the interposer 6 and the printed wiring board 100 may be connected with the bump 542 only, or may be connected with both a bump and a wire.

The material for an insulating film 503 is not particularly limited, and an inorganic insulating film such as $SiO_2$ and an organic insulating film made of a resin may be used. Here, an example of using an organic insulating film for the insulating film 503 will be mentioned.

A method of manufacturing the interposer in accordance with the eighth embodiment is nearly identical to a method of manufacturing an interposer in accordance with the first embodiment, excluding a step of forming a through-hole electrode. Accordingly, a step under a method of manufacturing an interposer in accordance with the eighth embodiment differing from a method of manufacturing an interposer in accordance with the first embodiment will be described.

Figure 17:
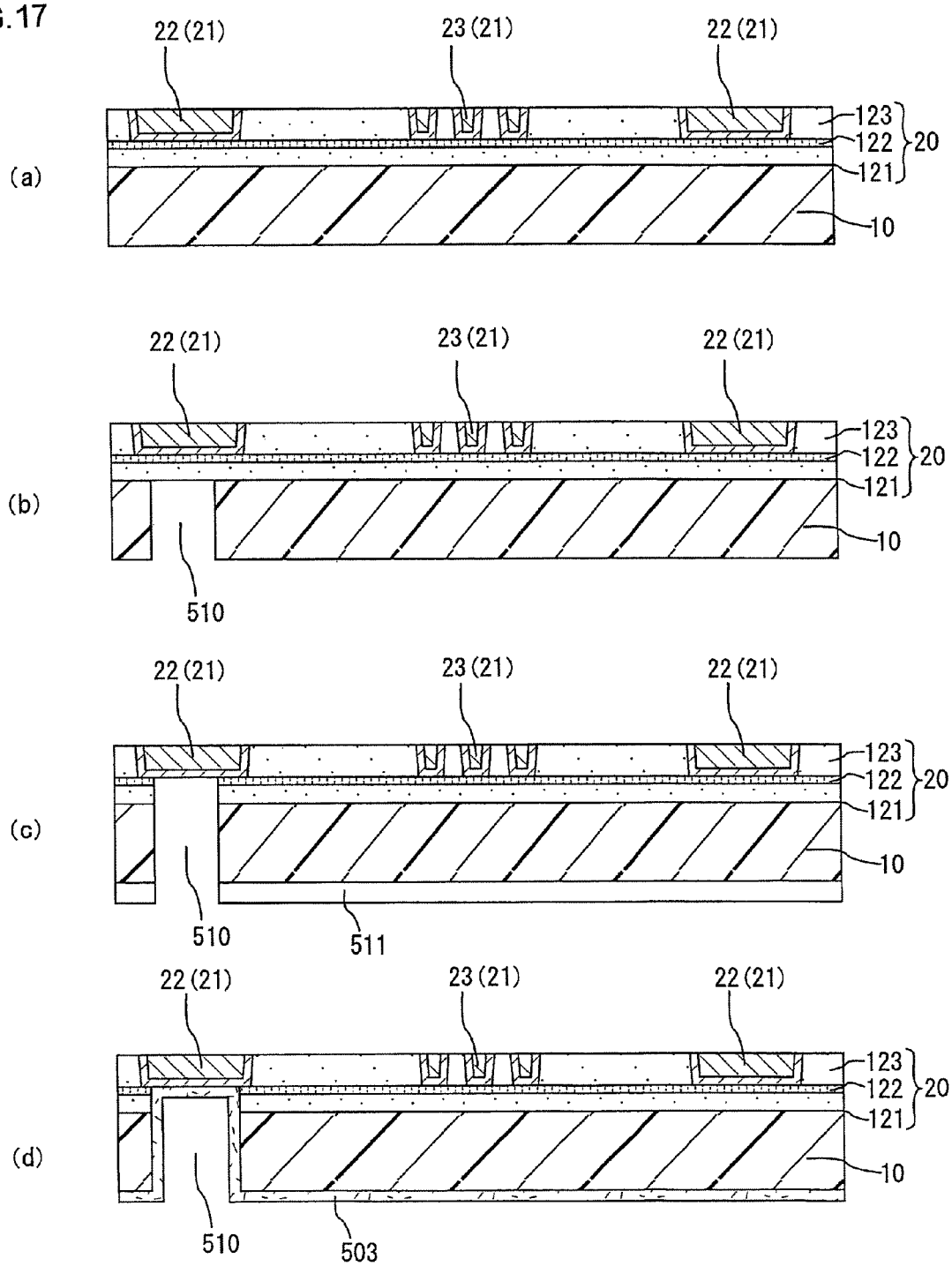
FIG. 17 (a), FIG. 17 (b), FIG. 17 (c) and FIG. 17 (d) are cross-sectional views illustrating part of a method of manufacturing an interposer according to the eighth embodiment.
Figure 18:
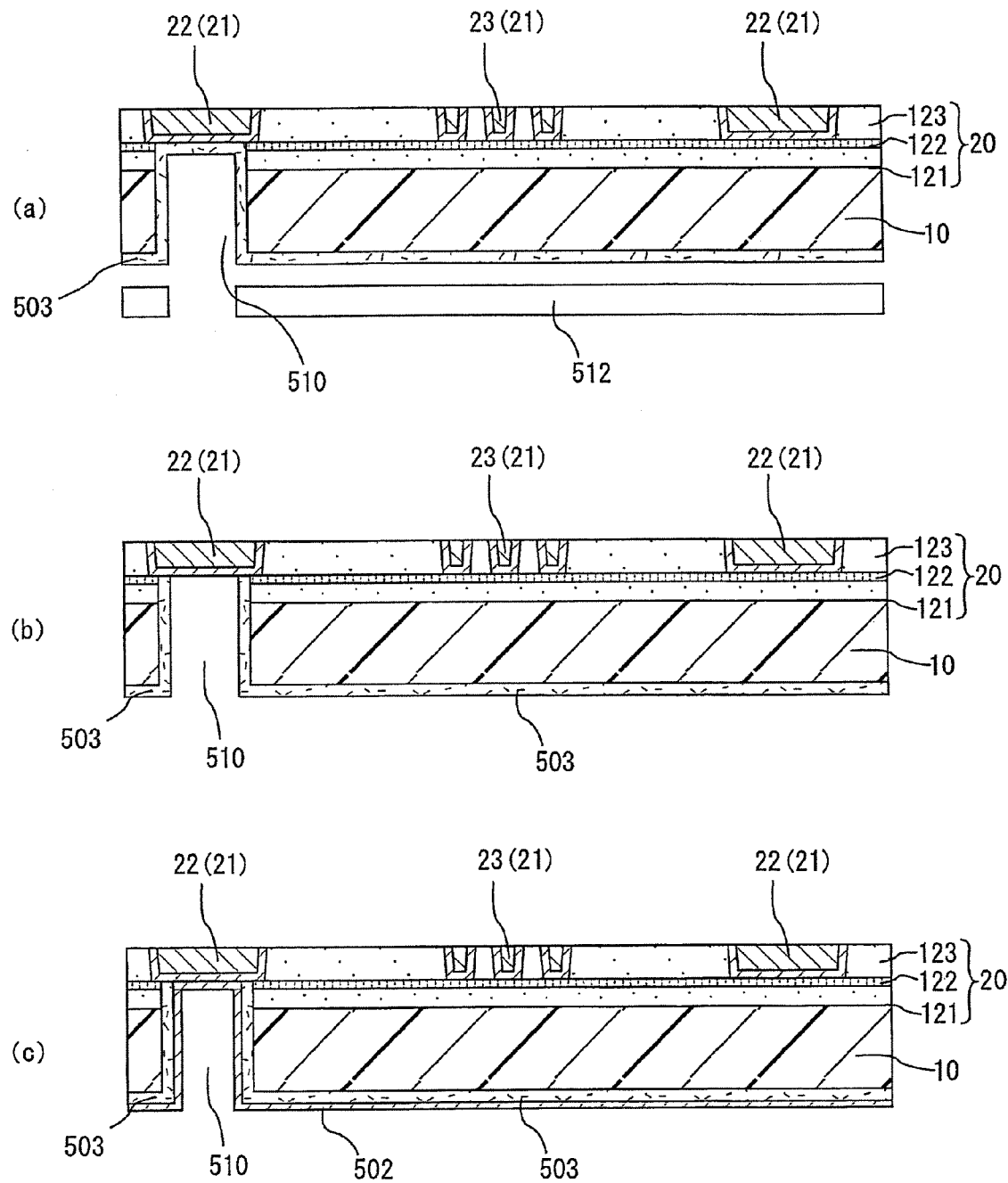
FIG. 18 (a), FIG. 18 (b) and FIG. 18 (c) are cross-sectional views illustrating part of a method of manufacturing the interposer according to the eighth embodiment.
Figure 19:
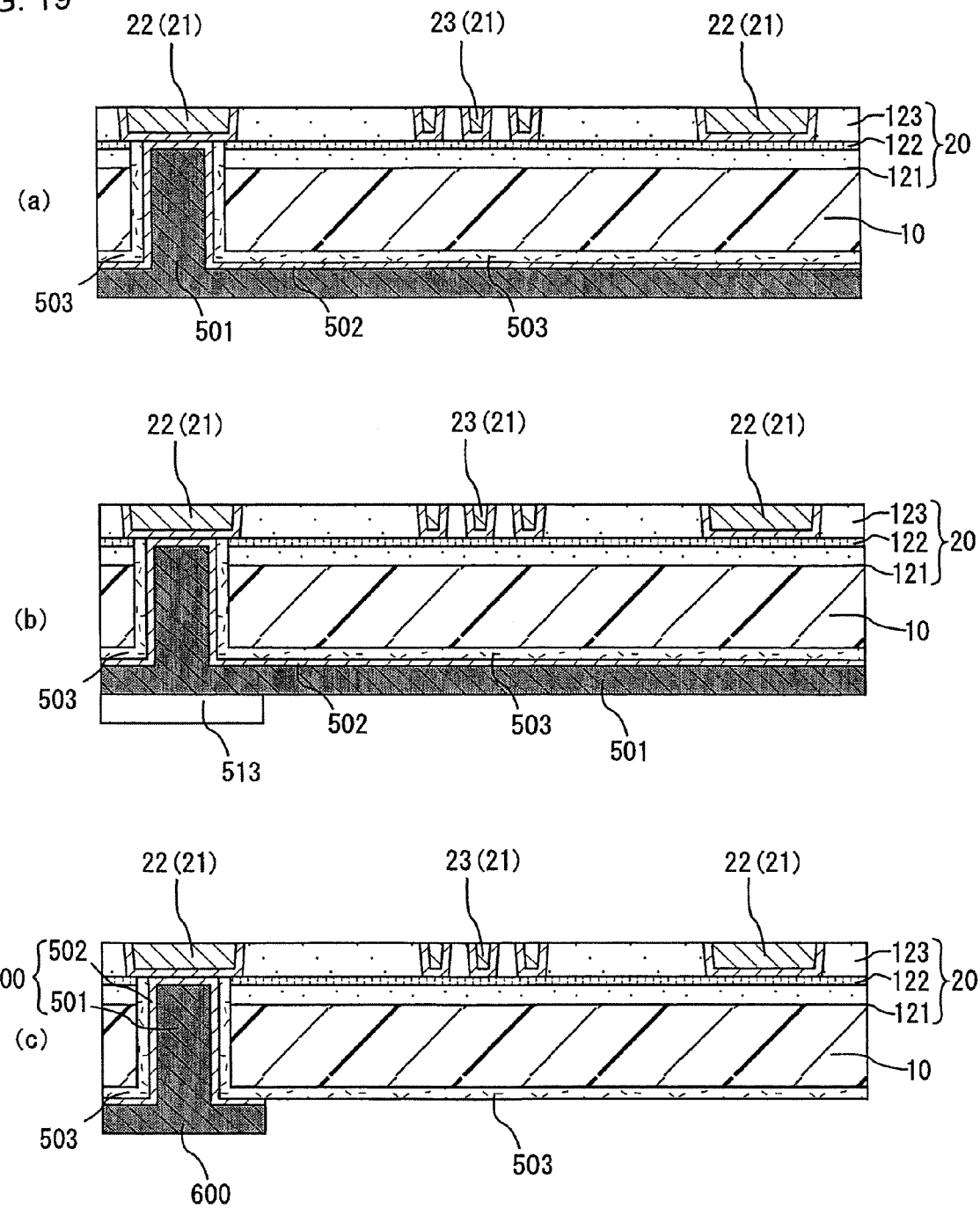
FIG. 19 (a), FIG. 19 (b) and FIG. 19 (c) are cross-sectional views illustrating part of a method of manufacturing the interposer according to the eighth embodiment.

FIG. 17 (a), FIG. 17 (b), FIG. 17 (c), FIG. 17 (d), FIG. 18 (a), FIG. 18 (b), FIG. 18 (c), FIG. 19 (a), FIG. 19 (b) and FIG. 19 (c) are cross-sectional views illustrating as parts of a method of manufacturing an interposer in accordance with the eighth embodiment. With respect to the present embodiment, likewise with the steps illustrated under a method of manufacturing an interposer in accordance with the first embodiment, a substrate having a structure similar to the structure illustrated in FIG. 4 (c) under the descriptions of the first embodiment is prepared (refer to FIG. 17 (a)).

Next, as illustrated in FIG. 17 (b), an opening 510 is formed at a predetermined location in the support substrate 10 with the use of a UV laser, for example. A method of forming this opening 510 is not particularly limited, and dry etching (reactive ion etching) and wet etching using an alkali solution, etc., may be employed. Further, as illustrated in FIG. 17 (c), a resist 511 is patterned such that the opening 510 is exposed. Then, it is subjected to dry etching (reactive ion etching) with the resist 511 as a mask, and the first $SiO_2$ layer 121 and an $Si_3N_4$ layer 122 are sequentially etched to expose the lower face of the via land 22.

Next, as illustrated in FIG. 17 (d), with the use of dip coating or spin coating a liquid resin is coated on the rear face side of the support substrate 10 and this is dried at about 200° C. for an hour to form the insulating film 503. At that time, the insulating film 503 is formed on the rear side surface of the support substrate 10 and the wall face of the opening 510. As for a liquid resin used in this step, an photosensitive resin (made by JSR Co., Ltd., product name: WPR, model number: 5100, for example) is preferably used from the standpoint that the insulating film 503 on the surface of the via land 22 can easily be removed as described later. Specifically, a liquid resin composed of 20 to 30% by weight of methyl ethyl ketone, 20 to 30% by weight of ethyl lactate, 15 to 25% by weight of filler, 5 to 15% by weight of novolak resin, 1 to 10% by weight of melamine group compound, 1 to 10% by weight of phenol group resin, 1 to 10% by weight of crosslinked rubber, 1 to 5% by weight of epoxy group compound, 1 to 5% by weight of low molecular weight phenol resin, 0.1 to 3% by weight of coupling agent, and 0.1 to 3% by weight of triazine group photosensitive agent can be mentioned. In addition, as to a method of forming an organic insulating film, vacuum vapor deposition, for example, beside spin coating and dip coating, may be mentioned.

Next, as illustrated in FIG. 18 (*a*), exposure is performed via a mask 512 having an opening at the location corresponding to the opening 510. Further, as illustrated in FIG. 18 (*b*), development is carried out, and the insulating film 503 at the site which has been exposed (the bottom portion of the opening 510) is removed. With the step described above, the lower face of the via land 22 is re-exposed on the rear face side of the support substrate 10.

Next, as illustrated in FIG. 18 (*c*), a conductor thin film 502 is formed on the lower face of the via land 22 exposed and on the surface of the insulating film 503. The conductor thin film 502 is made of Ni/Cu and formed by sputtering, for example. In addition, the structure of this conductor thin film 502 is not limited to this. And, a method of forming the conductor thin film 502 is not limited to sputtering, and electroless plating, for example, may be employed. Further, as illustrated in FIG. 19 (*a*), electrolytic copper plating is performed with the conductor thin film 502 as an electricity supply layer to form a copper plating layer 501.

Next, as illustrated in FIG. 19 (*b*), of the copper plating layer 501 there is formed a resist 513 at the location where a pad is to be formed. Next, as illustrated in FIG. 19 (*c*), the copper plating layer 501 and the conductor thin film 502 at the site where the resist 513 is not formed are removed by etching. With the steps described above, a through-hole electrode 500 and a pad 600 are formed.

With the present embodiment, not only the advantages (1) through (9) described under the first embodiment can be exhibited but also the following advantages can be exhibited.

(13) The formation of the through-hole electrode in the support substrate connects the interposer and the printed wiring board via the solder bumps. As a result of it, a shorter wiring distance can be worked out as compared to a case where the both are connected with a wire. Accordingly, an increase in resistance with respect to the wiring from the printed wiring board to the semiconductor elements can be controlled, allowing a voltage drop up to the semiconductor elements to be effectively controlled.

(14) And, as to an interposer in accordance with the present embodiment, the thermal expansion coefficient of the interposer is high since it contains an insulating film made of an organic resin as compared to the case where an inorganic insulating film is formed as an insulating film. Accordingly, it can dampen to an extent a mismatch in thermal expansion coefficients between the printed wiring board composed mainly of a resin and the interposer, allowing the connection reliability at the joining portion (bumps) of the interposer and the printed wiring board to be secured.

Other Embodiments

The conductor portion for connecting the first wiring and the second wiring may be a through-hole conductor.

The type and function of the semiconductor element to be loaded onto an interposer in accordance with the present invention is not particularly limited. And, the number and the loading configuration of the semiconductor element as such are not particularly limited as well. Namely, a setup in which multiple semiconductor elements are laminated may be mounted. That being the case, the through-hole electrodes provided in each of the semiconductor elements are mutually connected via a solder bump.

And, it may be that multiple inorganic insulating layers and/or organic insulating layers are provided and that the first wiring and/or the second wiring may be multilayered wiring.

As to the materials constituting the first wiring, the conductor portion and the second wiring are not particularly limited as long as it is a conductive material. Nickel, gold, silver, etc., besides copper can be mentioned.

As to the types of organic insulating layers, epoxy resin, phenol resin, polyimide resin, polyester resin, bismaleimide resin, polyolefin group resin, polyphenylene ether resin, polyphenylene resin, fluorine resin, etc., for example, can be mentioned as thermosetting resins. And, acrylic resin, etc., for example, can be mentioned as photosensitive resins.

As for the resins with a photosensitive group added to a portion of a thermosetting resin, those in which the thermosetting groups of the above-described thermosetting resins and a methacrylic acid and acrylic acid are acrylated, etc., can be mentioned. And, for thermoplastic resins, phenoxy resin, polyethersulfone (PES), polysulfone (PSF), polyphenylenesulfone (PPS), polyphenylenesulfide (PPES), polyphenylene ether (PPE), polyetherimide (PI), etc., can be mentioned.

And, as to specific combinations for resin combinations usable for an organic insulating layer, phenol resin/polyethersulfone, polyimide resin/polysulfone, epoxy resin/polyethersulfone, epoxy resin/phenoxy resin, acrylic resin/phenoxy resin, epoxy resin with a portion of the epoxy group acrylated/polyethersulfone, etc., for example, may be mentioned.

The relation between the diameter of a via land and the diameter of a via conductor is not particularly limited as long as the range allows the conduction between the via land and the via conductor can be secured, and they may be of the same diameter.

And, the type of, the exposure method for and the development method for the resist formed on an inorganic insulating layer and used when the first wiring is formed with a damascene method are not particularly limited so long as they are a resist, an exposure method, and a development method used in the semiconductor manufacture process.

As to the method of forming a seed layer on an inorganic insulating layer and an organic insulating layer, a method so-called PVD (physical vapor deposition) method, besides sputtering, may be used, and specifically, a method such as vacuum vapor deposition, ion plating and electron beam vapor deposition may be used. And, as to a method for forming a seed layer on an organic insulating layer, conventional methods known to the public for the formation of a conductor circuit by a semi-additive method may also be used.

A method for forming an organic insulating layer is not particularly limited, and a method for coating an uncured resin by a spin coater, a curtain coater, etc., and a method for forming a resin layer by thermocompression bonding of a resin film may be used. And, as to a method for hardening a resin, it is not limited to thermosetting.

And, as for a method for forming an opening in an organic insulating layer, it is not limited to an exposure and development treatment, and a method for forming an opening by a laser processing may be used. In this case, a method using an excimer laser, a UV-YAG laser, a carbon dioxide gas laser, etc., may be mentioned.

An interposer according to one embodiment includes at least one layer of an inorganic insulating layer, the first wiring formed in or on the surface of the above-described inorganic insulating layer, at least one layer of an organic insulating layer formed on the outmost layer inorganic insulating layer and on the above-described first wiring, the second wiring formed on the surface of the above-described organic insulating layer, and a conductor portion for connecting the above-described first wiring and the above-described second wiring.

According to the interposer as set forth above, there is present an organic insulating layer around the bottom portion of a conductor portion. Accordingly, even when the conductor portion expands on account of a semiconductor element generating heat, for example, the organic insulating layer present around the bottom portion of the conductor portion makes it possible to ease the thermal stress coming from the conductor portion. Accordingly, the thermal stress is controlled from being concentrated at the bottom portion of the conductor portion, enabling in turn to control the occurrence of cracks in the insulating layer.

However, when an organic insulating layer expands due to a semiconductor element generating heat, for example, a tensile stress is generated at the conductor portion resulting from such an expansion and a subsequent contraction of the organic insulating layer, and a problem could possibly occur that the conductor portion functioning as a via hole or a through hole becomes separated from the first wiring due to this tensile stress. In response to such a problem, the present embodiment has worked out to eliminate the problem of separation with the provision of an integrated inorganic insulating layer on the lower face of the organic insulating layer to secure rigidity and in turn to lower the tensile stress of the organic insulating layer with respect to the conductor portion.

According to an interposer of another embodiment, the above-described second wiring is thicker in thickness than the above-described first wiring. When an interposer is heated due to a semiconductor element generating heat, for example, an interposer on occasions becomes warped resulting from a difference in thermal expansion coefficient between a semiconductor element and an interposer. It is speculated that this results from the thermal expansion coefficient of an organic insulating layer being far greater as compared to a semiconductor element. Should the interposer ends up becoming warped with respect to the semiconductor element, it is possible that the connection reliability between the two drops resulting in a drop in quality. However, as in the present embodiment, the provision of an organic insulating layer between the second wiring relatively thicker than the first wiring and an inorganic insulating layer having a high Young's modulus adds rigidity to the interposer as the organic insulating layer is sandwiched between the second wiring having a high Young's modulus and the inorganic layer. As a result of it, the warpage of the interposer resulting from the difference in the above-described thermal expansion coefficients is controlled.

And, according to an interposer yet another embodiment, the ratio of the thickness of the second wiring to the thickness of the first wiring is greater than 1 and no greater than 15. This range allows the warpage of the interposer to be controlled as described above as the second wiring is thick, and at the same time the adhesion between the second wiring and the organic insulating layer to be easily controlled even when the organic insulating layer expands and contracts on account of the thermal history, for example. Namely, when the ratio of the thickness of the second wiring to the thickness of the first wiring is less than 1, a sufficient rigidity of the interposer cannot be secured and it is possible for the interposer to becomes warped resulting from the difference in thermal expansion coefficient between the semiconductor element and the interposer. Conversely, when the ratio of the thickness of the second wiring to the thickness of the first wiring exceeds 15, it results in the aspect ratio of the second wiring being high if one were to assume that they had the same wiring thickness, and when the organic insulating layer expands and contracts on account of the thermal history, for example, the second wiring ends up easily following that expansion and contraction of the organic insulating layer, and it is possible for the adhesion of the second wiring to the organic insulating layer to drop.

According to an interposer of still another embodiment, the ratio of the height of the above-described conductor portion to the thickness of the above-described first wiring is no greater than 5. According to this, it becomes possible to greatly reduce the impact of the stress occurring as resulting from the expansion and contraction of the organic insulating layer on the conductor portion.

According to an interposer of still another embodiment, the wiring length of the above-described second wiring is longer than that of the above-described first wiring. And, according to an interposer of still another embodiment, the above-described second wiring is larger in sectional area than the above-described first wiring. The shape of the second wiring being such a shape, it becomes possible to reduce the wiring resistance of the second wiring.

According to an interposer of still another embodiment, the above-described second wiring is lower in wiring resistance per unit length than the above-described first wiring. A reduction in wiring resistance per unit length of the second wiring provides an interposer suitable for large-capacity signal transmission and high-speed signal transmission. In addition, the measurement method of wiring resistance is not particularly limited. To give an example, wiring resistance can be measured with a resistance measurement instrument connected to a specific wiring via a probe. As for the measurement instrument, Impedance/Gain-Phase Analyzer made by Agilent Technologies (Model Number: 4194A), for example, can be mentioned. And, according to an interposer of still another embodiment, the above-described first wiring is smaller in L/S than the above-described second wiring. This allows the routing of fine wiring using the first wiring in an inorganic insulating layer or on the surface of an inorganic insulating layer.

According to an interposer of still another embodiment, there is formed a protective film on the surface of the outermost layer organic insulating layer. According to this, the inside wiring layer is protected and the damage thereto can be controlled.

According to an interposer of still another embodiment, there is further provided an inorganic thin film formed between the above-described outermost layer inorganic insulating layer and the above-described organic insulating layer. The provision of an inorganic thin film between the inorganic insulating layer and the organic insulating layer can enhance the adhesion between the inorganic insulating layer and the organic insulating layer.

An interposer of still another embodiment is further provided with a support substrate and the above-described inorganic insulating layer is formed on the above-described support substrate. And, according to an interposer of still another embodiment, the above-described support substrate is of silicon. Having a support substrate enhances rigidity such that it reduces the warpage of an interposer due to thermal expansion. And, since the degree of flatness of the support substrate made of silicon is extremely high, it becomes possible to form a fine wiring of the surface thereof. Further, the warpage of the interposer due to the difference in thermal expansion coefficient between the semiconductor element to be loaded and the interposer can be controlled.

According to an interposer of still another embodiment, the above-described first wiring is formed in the above-described inorganic insulating layer. And, according to an interposer of still another embodiment, the surface of the above-described first wiring and the surface of the above-described inorganic insulating layer are on nearly the same plane. When this surface is flat, the second insulating layer, a conductor portion, the second wiring, etc., can be accurately formed on that face, and it can provide an interposer with a high degree of flatness.

An interposer of still another embodiment further includes a group of pads formed on the surface of the above-described organic insulating layer and onto which a semiconductor element is loaded and a stiffener having openings or recessed portions for exposing said group of pads. The provision of the stiffener enhances the rigidity of the interposer. It results in the interposer being able to sufficiently withstand the thermal stress resulting from a thermal expansion coefficient difference from that of the semiconductor element such that the interposer as a whole becomes difficult to warp. Accordingly, the occurrence of cracks at the joining portion between the semiconductor element and the interposer (an external connection terminal such as a solder bump) is controlled.

A method of manufacturing an interposer according to an embodiment of the present invention includes forming an inorganic insulating layer on a support substrate, forming the first wiring in or on the surface of the above-described inorganic insulating layer, forming an organic insulating layer on the outermost layer inorganic insulating layer and on the above-described first wiring, and forming the second wiring on the above-described organic insulating layer and at the same time forming a conductor portion for connecting the above-described second wiring and the above-described first wiring. According to these steps, an interposer in which a stress exerting on the conductor portion can be effectively reduced and cracks in turn would not occur and the conductor portion and the via land would not become separated.

In a method of manufacturing an interposer according to another embodiment, the above-described first wiring is formed by a damascene method. The use of a damascene method allows an accurate formation of the first wiring with fine wiring. Further, it allows the formation of wiring with a high degree of flatness.

In a method of manufacturing an interposer according to yet another embodiment, the above-described second wiring is formed by a semi-additive method. The use of a semi-additive method allows the accurate formation of the second wiring at a low cost.

A method of manufacturing an interposer according to still another embodiment includes removing the above-described support substrate. The removal of the support substrate allows the manufacture of an interposer being thin in thickness and low in terms of the mounted height when a semiconductor element is loaded.

Obviously, numerous modifications and variations of the present invention are possible in light of the above teachings. It is therefore to be understood that within the scope of the appended claims, the invention may be practiced otherwise than as specifically described herein.

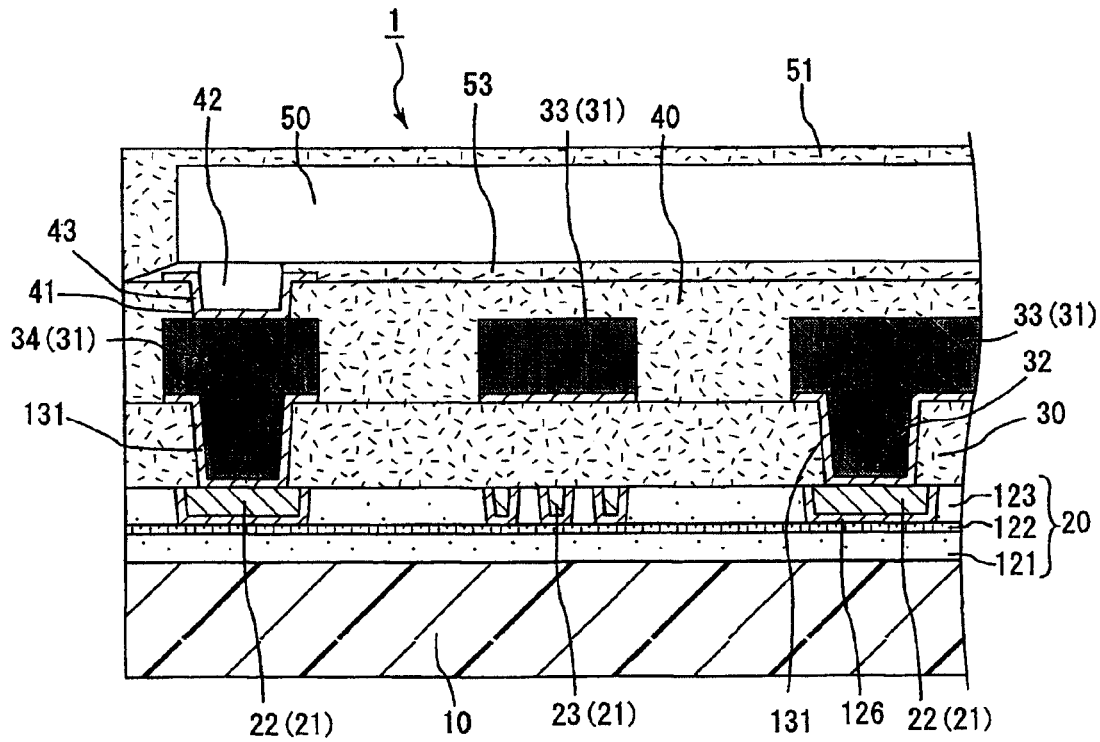

What is claimed is:

1. An interposer comprising:
   an inorganic insulating layer;
   a first wiring formed in or on a surface of the inorganic insulating layer;
   an organic insulating layer formed over the inorganic insulating layer and on the first wiring;
   a second wiring formed on the organic insulating layer; and
   a conductor portion connecting the first wiring and the second wiring, wherein the second wiring is thicker in thickness than the first wiring, and wherein the second wiring is longer in wiring length than the first wiring.

2. An interposer as set forth in claim 1, wherein the second wiring is thicker in thickness than the first wiring.

3. An interposer as set forth in claim 1, wherein a ratio of the thickness of the second wiring to the thickness of the first wiring is greater than 1 and no greater than 15.

4. An interposer as set forth in claim 1, wherein a ratio of a height of the conductor portion to the thickness of the first wiring is no greater than 5.

5. An interposer as set forth in claim 1, wherein the second wiring is longer in wiring length than the first wiring.

6. An interposer as set forth in claim 1, wherein the second wiring is larger in sectional area than the first wiring.

7. An interposer as set forth in claim 1, wherein the second wiring is lower in wiring resistance per unit length than the first wiring.

8. An interposer as set forth in claim 1, wherein the first wiring is smaller in L/S than the second wiring.

9. An interposer as set forth in claim 1, further comprising a protective film formed on the surface of the organic insulating layer.

10. An interposer as set forth in claim 1, further comprising an inorganic thin film formed between the inorganic insulating layer and the organic insulating layer.

11. An interposer as set forth in claim 1, further comprising a support substrate wherein the inorganic insulating layer is formed on the support substrate.

12. An interposer as set forth in claim 11, wherein the support substrate comprises silicon.

13. An interposer as set forth in claim 1, wherein the first wiring is formed in the inorganic insulating layer.

14. An interposer as set forth in claim 1, wherein a surface of the first wiring and the surface of the inorganic insulating layer are substantially on a same plane.

15. An interposer as set forth in claim 1, further comprising a plurality of pads formed on a surface of the organic insulating layer and a stiffener having openings or recessed portions for exposing the pads, wherein the pads are configured to load a semiconductor element.

16. A method of manufacturing an interposer comprising:
   forming an inorganic insulating layer over a support substrate;
   forming a first wiring in or on a surface of the inorganic insulating layer;
   forming an organic insulating layer over the inorganic insulating layer and the first wiring;
   forming a second wiring on the organic insulating layer; and forming a conductor portion connecting the second wiring and the first wiring, wherein the second wiring is thicker in thickness than the first wiring, and wherein the second wiring is longer in wiring length than the first wiring.

17. A method of manufacturing an interposer as set forth in claim 16, wherein the forming of the first wiring comprises forming the first wiring by a damascene method.

18. A method of manufacturing an interposer as set forth in claim 16, wherein the forming of the second wiring comprises forming the second wiring by a semi-additive method.

19. A method of manufacturing an interposer as set forth in claim 16, further comprising removing the support substrate.

20. A method of manufacturing an interposer as set forth in claim 16, wherein the forming of the second wiring and the forming of the conductor portion are performed in one process.

* * * * *

UNITED STATES PATENT AND TRADEMARK OFFICE
CERTIFICATE OF CORRECTION

| | | |
|---|---|---|
| PATENT NO. | : 8,058,563 B2 | Page 1 of 1 |
| APPLICATION NO. | : 12/345295 | |
| DATED | : November 15, 2011 | |
| INVENTOR(S) | : Hajime Sakamoto et al. | |

It is certified that error appears in the above-identified patent and that said Letters Patent is hereby corrected as shown below:

Column 20, Claims 2 and 5 should be deleted.

Signed and Sealed this
Eighth Day of May, 2012

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 8,058,563 B2 | |
| APPLICATION NO. | : 12/345295 | |
| DATED | : November 15, 2011 | |
| INVENTOR(S) | : Hajime Sakamoto et al. | |

It is certified that error appears in the above-identified patent and that said Letters Patent is hereby corrected as shown below:

Delete the title page and substitute therefore the attached title page showing the corrected number of claims in patent.

Column 20, lines 5 and 6, delete claim 2.

Column 20, lines 13 and 14, delete claim 5.

This certificate supersedes the Certificate of Correction issued May 8, 2012.

Signed and Sealed this
Twelfth Day of June, 2012

David J. Kappos
*Director of the United States Patent and Trademark Office*

(12) United States Patent
Sakamoto et al.

(10) Patent No.: US 8,058,563 B2
(45) Date of Patent: Nov. 15, 2011

(54) INTERPOSER AND METHOD FOR MANUFACTURING INTERPOSER

(75) Inventors: Hajime Sakamoto, Ogaki (JP); Toshiki Furutani, Ogaki (JP); Hiroshi Segawa, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 403 days.

(21) Appl. No.: 12/345,295

(22) Filed: Dec. 29, 2008

(65) Prior Publication Data

US 2009/0175023 A1   Jul. 9, 2009

Related U.S. Application Data

(60) Provisional application No. 61/038,949, filed on Mar. 24, 2008, provisional application No. 61/017,430, filed on Dec. 28, 2007.

(51) Int. Cl.
*H05K 1/03* (2006.01)

(52) U.S. Cl. ........ 174/256; 174/261; 174/255; 361/760; 361/767

(58) Field of Classification Search .......... 361/792, 361/728, 729, 736, 790, 795, 760, 767, 771, 361/783; 174/250, 255–259, 260, 261, 262
See application file for complete search history.

(56) References Cited

U.S. PATENT DOCUMENTS

| | | | | |
|---|---|---|---|---|
| 5,310,965 | A * | 5/1994 | Senba et al. | 174/250 |
| 5,461,545 | A * | 10/1995 | Leroy et al. | 361/765 |
| 6,037,044 | A * | 3/2000 | Giri et al. | 428/209 |
| 6,252,178 | B1 * | 6/2001 | Hashemi | 174/260 |
| 6,737,741 | B2 * | 5/2004 | Imasu et al. | 257/723 |
| 2007/0128465 | A1 * | 6/2007 | Liu et al. | 428/689 |

FOREIGN PATENT DOCUMENTS

| | | |
|---|---|---|
| JP | 2005-317705 | 11/2005 |
| JP | 2006-019368 | 1/2006 |
| JP | 2006-294692 | 10/2006 |

* cited by examiner

*Primary Examiner* — Hoa C Nguyen
(74) *Attorney, Agent, or Firm* — Oblon, Spivak, McClelland, Maier & Neustadt, L.L.P.

(57) ABSTRACT

An interposer includes an inorganic insulating layer, a first wiring formed in or on a surface of the inorganic insulating layer, an organic insulating layer formed over the inorganic insulating layer and on the first wiring, a second wiring formed on the organic insulating layer, and a conductor portion connecting the first wiring and the second wiring.

18 Claims, 19 Drawing Sheets